US011024653B2

(12) United States Patent
Kim

(10) Patent No.: US 11,024,653 B2
(45) Date of Patent: Jun. 1, 2021

(54) DISPLAY DEVICE

(71) Applicant: SAMSUNG DISPLAY CO., LTD., Yongin-si (KR)

(72) Inventor: Min Soo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/401,843

(22) Filed: May 2, 2019

(65) Prior Publication Data
US 2020/0098793 A1   Mar. 26, 2020

(30) Foreign Application Priority Data

Sep. 20, 2018 (KR) .......................... 10-2018-0112765

(51) Int. Cl.
| | | |
|---|---|---|
| G06F 3/044 | (2006.01) | |
| H01L 27/12 | (2006.01) | |
| G06F 3/041 | (2006.01) | |
| H05K 1/11 | (2006.01) | |
| H05K 5/00 | (2006.01) | |

(52) U.S. Cl.
CPC ............ *H01L 27/124* (2013.01); *G06F 3/044* (2013.01); *G06F 3/0412* (2013.01); *H05K 1/118* (2013.01); *H05K 5/0017* (2013.01)

(58) Field of Classification Search
CPC .......... G06F 3/044; G06F 3/041; G06F 16/51; G06F 16/54; G06F 1/1601; G06F 1/1605; G06F 1/1618
See application file for complete search history.

(56) References Cited

U.S. PATENT DOCUMENTS

| D806,705 S | 1/2018 | Akana et al. | |
|---|---|---|---|
| 2005/0133250 A1* | 6/2005 | Baba ...................... | H05K 1/189 174/254 |
| 2008/0158498 A1* | 7/2008 | Chang ............... | G02F 1/133305 349/158 |
| 2011/0157087 A1* | 6/2011 | Kanehira .............. | G06F 3/0414 345/174 |
| 2011/0310035 A1* | 12/2011 | Kim ...................... | G06F 3/0445 345/173 |
| 2012/0062447 A1* | 3/2012 | Tseng ................ | G02F 1/133305 345/33 |
| 2012/0162876 A1* | 6/2012 | Kim ..................... | H04M 1/0237 361/679.01 |
| 2012/0274423 A1* | 11/2012 | Kato ........................ | H01P 3/08 333/238 |
| 2014/0111953 A1* | 4/2014 | McClure ............... | G06F 3/0443 361/749 |
| 2014/0232956 A1* | 8/2014 | Kwon ................. | H01L 27/3276 349/12 |

(Continued)

*Primary Examiner* — Olga V Merkoulova
(74) *Attorney, Agent, or Firm* — Lewis Roca Rothgerber Christie LLP

(57) ABSTRACT

A display device includes: a display panel; a first board connected to a side of a surface of the display panel and bent in a direction of the display panel to overlap with the display panel; a second board connected to another side of the surface of the display panel and bent in the direction of the display panel to overlap with the display panel; a driving member on the first board; and a first pressure sensing member on the second board, and the first board is connected to the second board.

16 Claims, 16 Drawing Sheets

(56) References Cited

U.S. PATENT DOCUMENTS

| | | | |
|---|---|---|---|
| 2015/0036299 A1* | 2/2015 | Namkung | G02F 1/133345 |
| | | | 361/749 |
| 2016/0004110 A1* | 1/2016 | Imai | G02F 1/1339 |
| | | | 349/42 |
| 2016/0066409 A1* | 3/2016 | Kwon | H01L 23/562 |
| | | | 174/254 |
| 2016/0094079 A1* | 3/2016 | Hiroki | H02J 7/025 |
| | | | 320/101 |
| 2016/0266672 A1* | 9/2016 | Inagaki | G09F 9/30 |
| 2017/0045918 A1* | 2/2017 | Han | G06F 1/163 |
| 2017/0048990 A1* | 2/2017 | Sim | H04M 1/026 |
| 2018/0032450 A1* | 2/2018 | Lee | G06F 13/10 |
| 2018/0188849 A1* | 7/2018 | Ko | G06F 3/044 |
| 2018/0288889 A1* | 10/2018 | Fordham | H05K 5/0086 |

* cited by examiner

DISPLAY DEVICE

CROSS-REFERENCE TO RELATED APPLICATION

This application claims priority to and the benefit of Korean Patent Application No. 10-2018-0112765, filed on Sep. 20, 2018 in the Korean Intellectual Property Office, the entire disclosure of which is incorporated herein by reference.

BACKGROUND

1. Field

Aspects of embodiments of the present disclosure relate to a display device.

2. Description of the Related Art

Display devices become more and more important and find a variety of applications as multimedia technology evolves. For example, display devices can be employed by portable electronic devices, such as smartphones, smart watches, tablet PCs, and notebook computers, or large electronic devices, such as televisions, monitors, and digital information displays.

Recently, there is demand for the development of a display device having a larger ratio of the area of the screen to the area of an electronic device, i.e., improved screen-to-body ratio. As the screen-to-body ratio increases, a wider screen can be provided without increasing the size of the display device, and the aesthetic appearance can be improved.

Further, studies are being conducted to provide an improved user interface by developing the structure and features of the display device in consideration of the user convenience.

SUMMARY

According to aspects of embodiments of the present disclosure, a display device has an increased ratio of the area occupied by the display area to the entire area of the display device when viewed from the top, and has an enhanced user interface.

These and other aspects, embodiments and advantages of the present disclosure will become immediately apparent to those of ordinary skill in the art upon review of the description and claims to follow.

According to one or more exemplary embodiments of the present disclosure, a display device comprises: a display panel; a first board connected to a side of a surface of the display panel and bent in a direction of the display panel to overlap with the display panel; a second board connected to another side of the surface of the display panel and bent in the direction of the display panel to overlap with the display panel; a driving member on the first board; and a first pressure sensing member on the second board, wherein the first board is connected to the second board.

The first board may comprise a first portion attached to the side of the surface of the display panel, and a second portion protruding from the first portion toward the other side of the display panel.

The second portion of the first board may be connected to the second board.

The driving member may be electrically connected to the first pressure sensing member.

The first pressure sensing member may comprise a first conductive layer on a surface of the second board, and a second conductive layer on the first conductive layer.

The first conductive layer may comprise a shielding electrode.

The display device may further comprise a bracket on the other surface of the display panel and on a surface of the first pressure sensing member, the bracket covering the display panel and the first pressure sensing member, wherein the bracket comprises a metallic material.

The first pressure sensing member may comprise a first insulating layer between the first conductive layer and the second conductive layer, and a second insulating layer between the second conductive layer and the bracket, and the second insulating layer may comprise a dielectric material to insulate the second conductive layer from the bracket.

The bracket may form a capacitance with the second conductive layer, with the second insulating layer therebetween.

The display device may further comprise a second pressure sensing member on the first board.

The second pressure sensing member may comprise a third conductive layer on a surface of the first board; a fourth conductive layer on the third conductive layer; a third insulating layer between the third conductive layer and the fourth conductive layer; and a fourth insulating layer on the fourth conductive layer.

The third conductive layer may comprise a shielding electrode, and the fourth insulating layer may comprise a dielectric material.

A width of the second portion may be smaller than a width of the first portion.

The display device may further comprise a touch panel above the display panel; and a third board connected to a side of a surface of the touch panel and overlapping with the display panel in a thickness direction, wherein the third board is connected to the first board.

According to one or more exemplary embodiments of the present disclosure, a display device comprises: a display panel; a touch panel above the display panel; a first printed circuit board connected to a side of a surface of the display panel and bent in a direction of the display panel to overlap with the display panel; a second printed circuit board connected to a side of a surface of the touch panel adjacent to another side of the display panel and bent in the direction of the display panel to overlap with the display panel; a driving member on the first printed circuit board; and a first pressure sensing member on the second printed circuit board, wherein the first printed circuit board is connected to the second printed circuit board.

The first printed circuit board may comprise a first portion attached to the side of the surface of the display panel, and a second portion protruding from the first portion toward the other side of the display panel.

The driving member may be electrically connected to the first pressure sensing member.

The first pressure sensing member may comprise a first conductive layer on the second printed circuit board; a second conductive layer above the first conductive layer; a first insulating layer between the first conductive layer and the second conductive layer; and a second insulating layer on the second conductive layer.

The display device may further comprise a second pressure sensing member on the first printed circuit board.

The second pressure sensing member may comprise a third conductive layer on the first printed circuit board; a fourth conductive layer above the third conductive layer; a third insulating layer between the third conductive layer and the fourth conductive layer; and a fourth insulating layer on the fourth conductive layer.

According to exemplary embodiments of the present disclosure, there is provided a display device that has an increased ratio of the area occupied by the display area to the entire area of the display device when viewed from the top, and has an enhanced user interface.

It should be noted that aspects and effects of the present disclosure are not limited to those described above and other aspects and effects of the present disclosure will be apparent to those skilled in the art from the following description.

DETAILED DESCRIPTION

Figure 1:
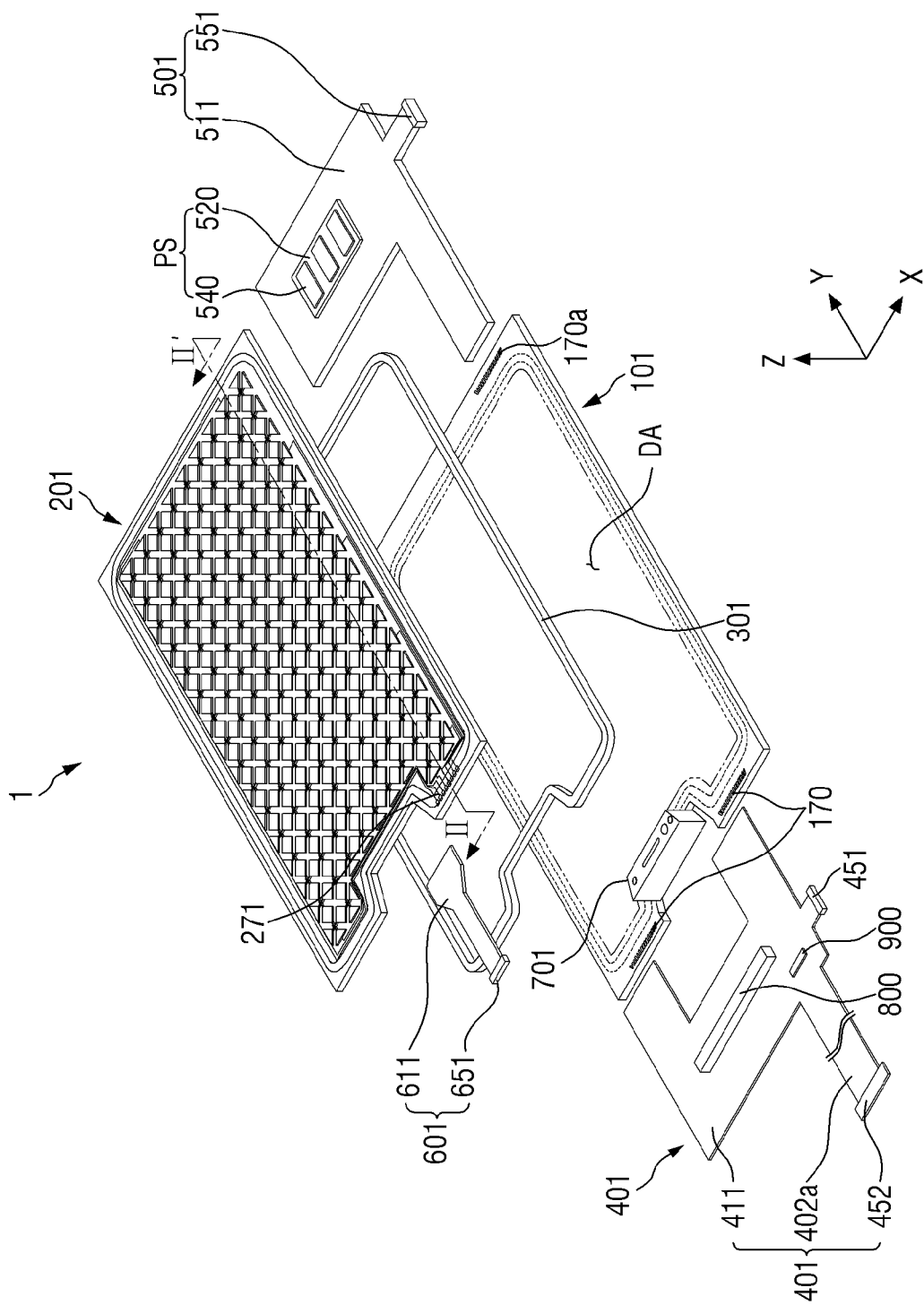
FIG. 1 is an exploded, perspective view of a display device according to an exemplary embodiment of the present disclosure.

Aspects and features of the present invention and methods for achieving the aspects and features will be apparent by referring to some exemplary embodiments to be described in further detail with reference to the accompanying drawings. However, the invention is not limited to the embodiments disclosed herein, but may be implemented in various forms. The matters defined in the description, such as the detailed construction and elements, are provided to assist those of ordinary skill in the art in a comprehensive understanding of the invention; however, the invention is defined within the scope of the appended claims.

Where an element is described as being related to another element, such as being "on" another element or "located on" a different element or a layer, this includes both a case in which an element is located directly on another element or a layer and a case in which an element is located on another element via another layer or still another element. In contrast, where an element is described as being related to another element, such as being "directly on" another element or "located directly on" a different element or a layer, this indicates a case in which an element is located on another element or a layer with no intervening element or layer therebetween.

Throughout the specification, the same reference numerals are used for the same or similar parts.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise. It is to be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
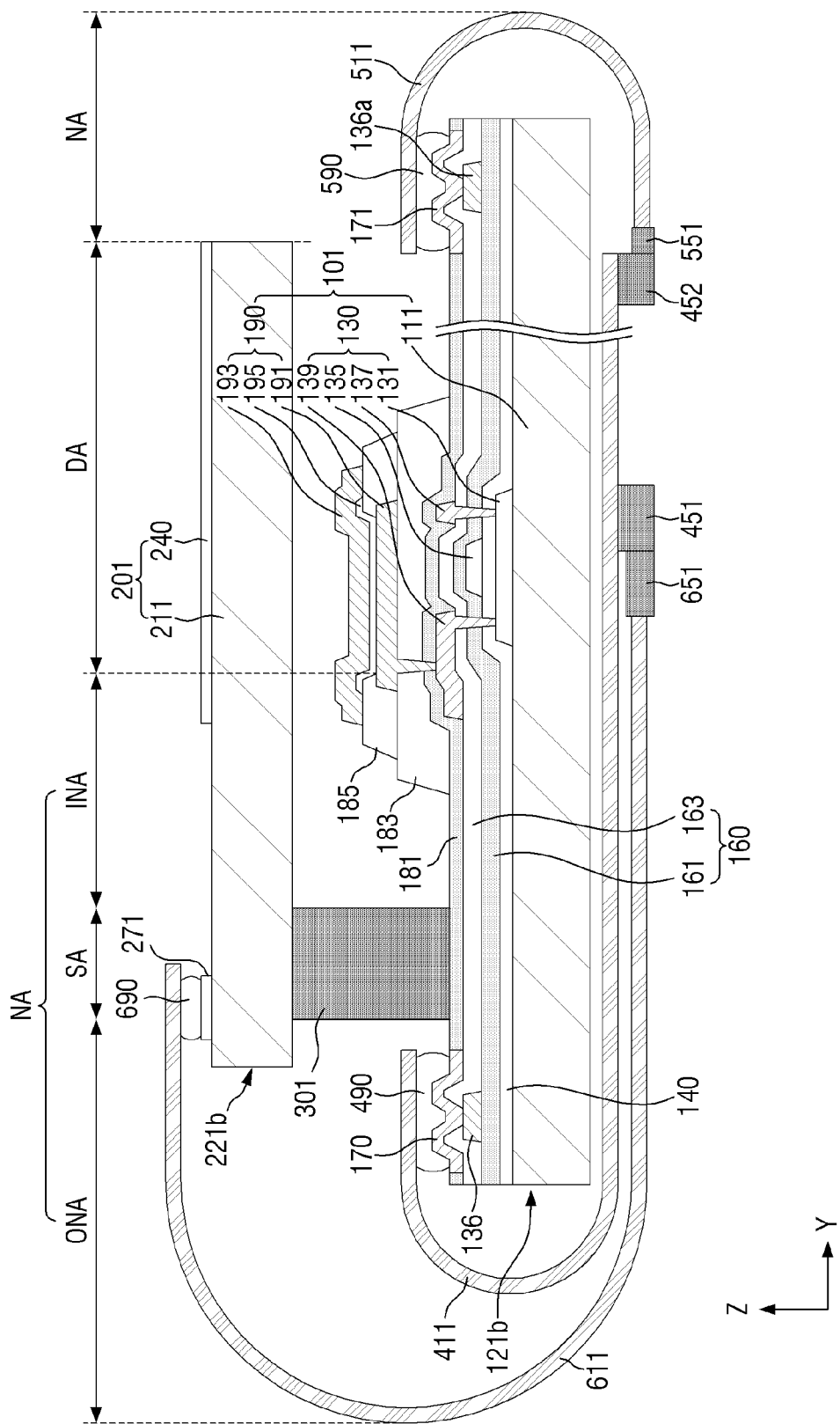
FIG. 2 is a cross-sectional view of the display device, taken along the line II-II' of FIG. 1.
Figure 3:
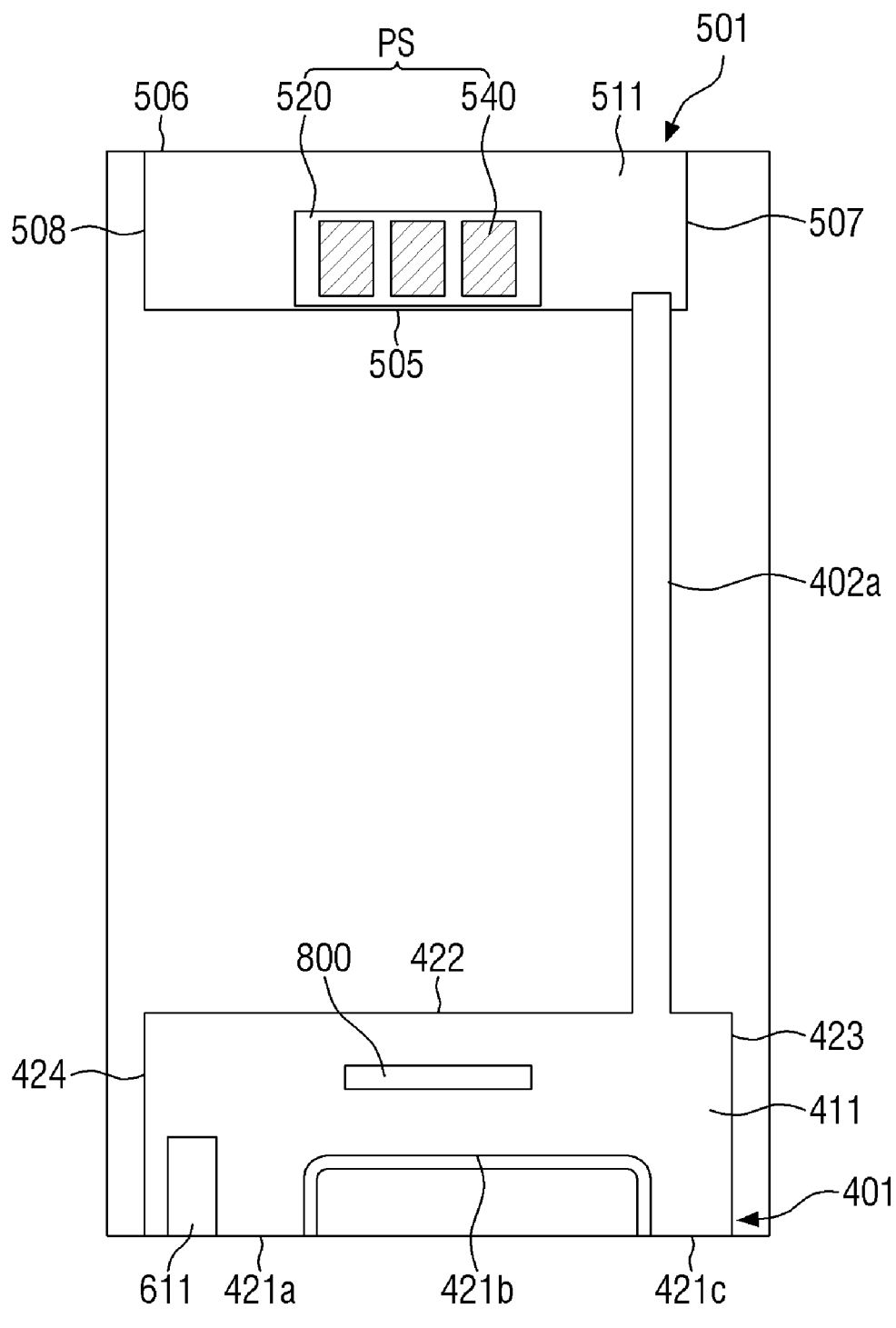
FIG. 3 is a view showing the layout of a rear face of the display device of FIG. 1.
Figure 4:
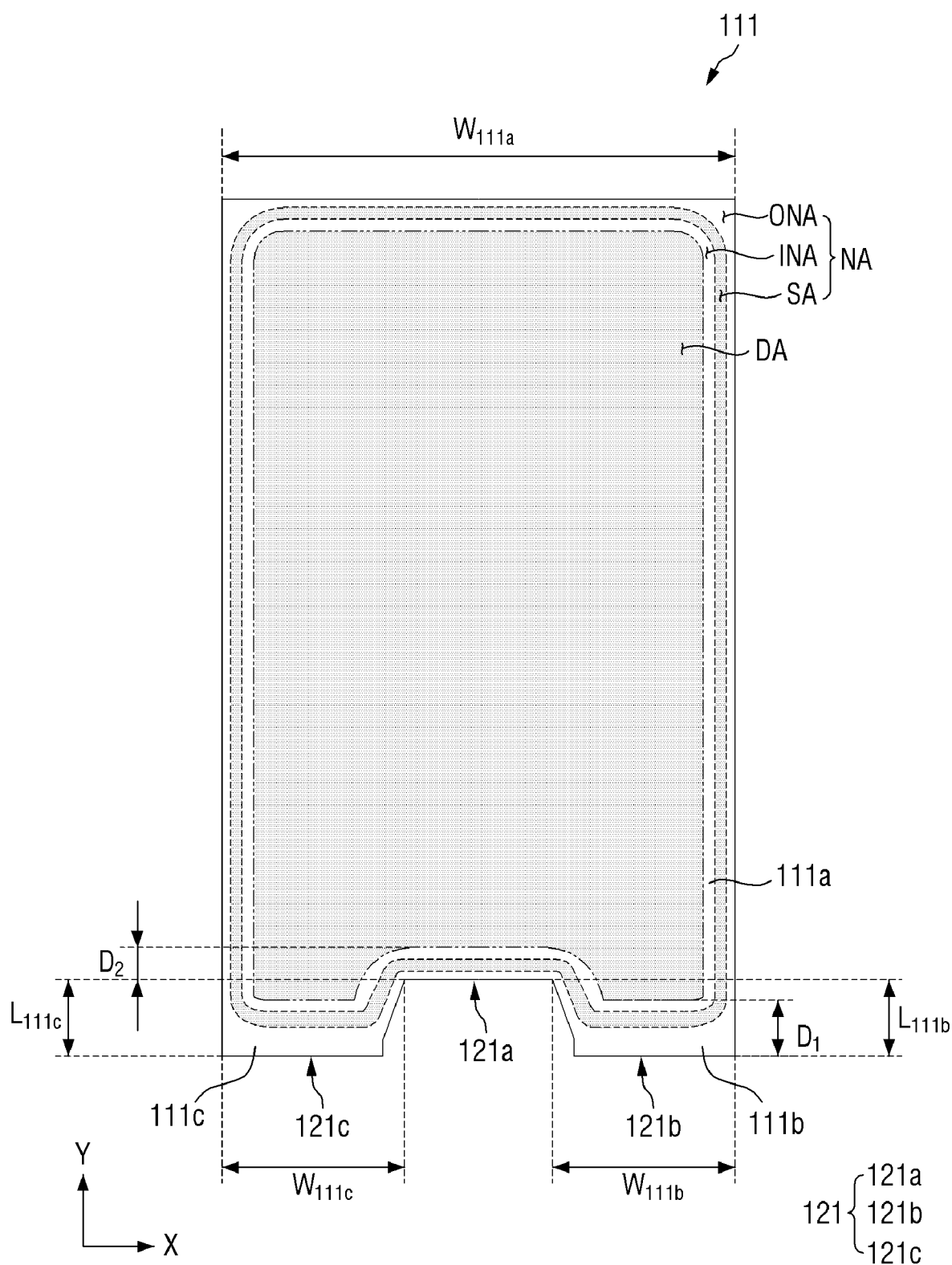
FIG. 4 is a plan view showing the layout of a first base substrate of a display panel of the display device of FIG. 1.
Figure 5:
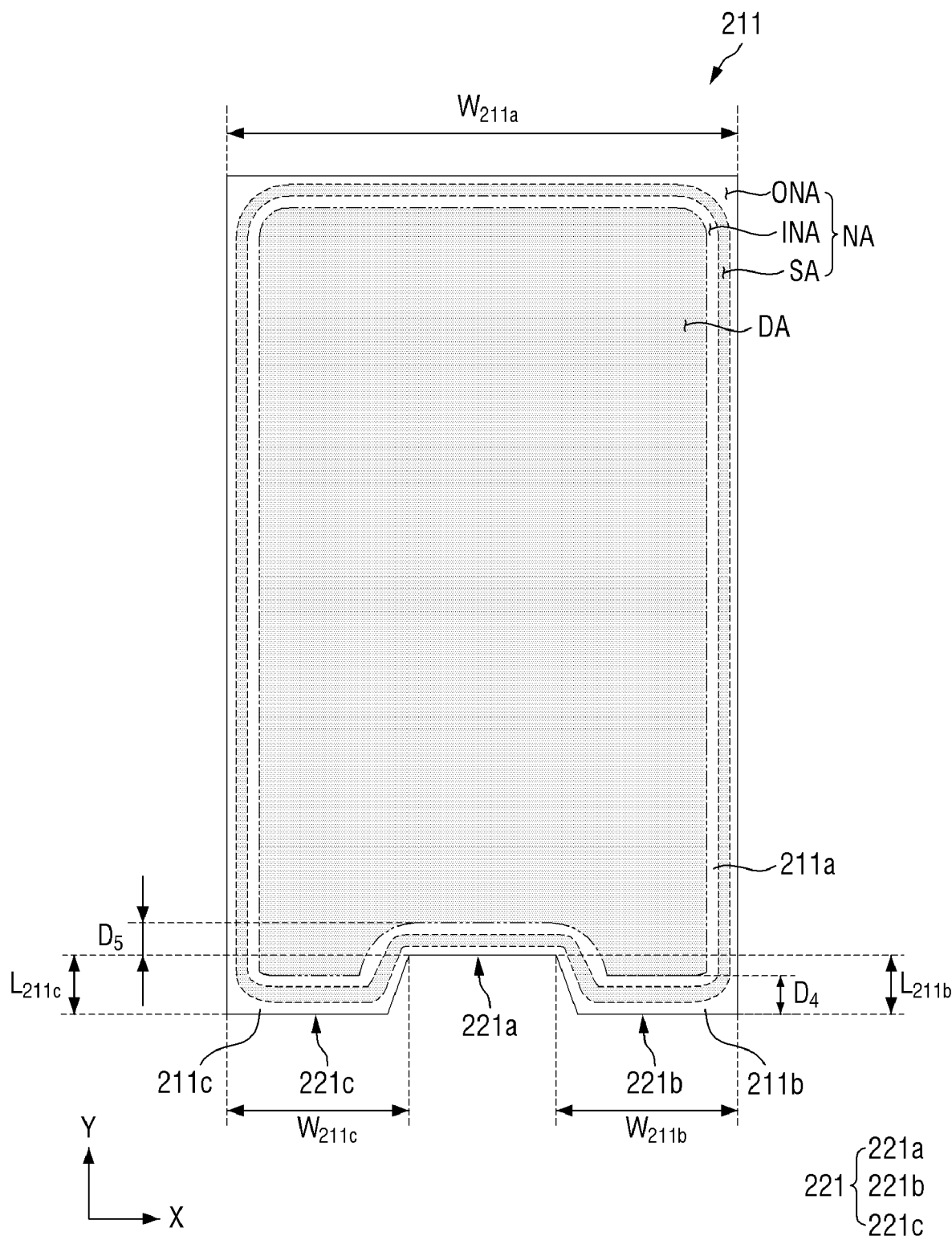
FIG. 5 is a plan view showing a second base substrate of an opposing substrate of the display device of FIG. 1.

FIG. 1 is an exploded, perspective view of a display device according to an exemplary embodiment of the present disclosure; FIG. 2 is a cross-sectional view of the display device, taken along the line II-II' of FIG. 1; FIG. 3 is a view showing the layout of the rear face of the display device of FIG. 1; FIG. 4 is a view showing the layout of a first base substrate of a display panel of the display device of FIG. 1; and FIG. 5 is a plan view showing a second base substrate of an opposing substrate of the display device of FIG. 1.

Referring to FIGS. 1 to 5, a display area DA and a non-display area NA may be defined in a display device 1 according to the exemplary embodiment of the present disclosure.

The display area DA may include a plurality of pixels and may display images therein. As used herein, the term "pixel" refers to a unit area recognized by a viewer by dividing the display device or the display area DA into sub-areas for representing a color when viewed from the top. A single pixel may represent a predetermined one of primary colors. The primary colors may include, but are not limited to, red, green, and blue. In an exemplary embodiment, one edge (e.g., the lower edge in FIG. 4) of the display area DA may be partially depressed inwardly when viewed from the top. For example, the edge extended in a first direction X of the display area DA may have an atypical shape including a bay, notch, or trench when viewed from the top.

When viewed from the top, the display area DA may be surrounded by the non-display area NA. The non-display area NA is not involved in displaying images. The non-display area NA may include a sealing area SA overlapping with a sealing member 301 to be described below, an inner non-display area INA located more to the inside than the sealing area SA (i.e., between the display area DA and the sealing area SA), and an outer non-display area ONA located more to the outside than the sealing area SA. In addition, the non-display area NA may further include first and second pad portions 171 (170, 170a) for transmitting a signal applied from an external device to the display area DA.

According to an exemplary embodiment of the present disclosure, the display device 1 may include a display panel 101, an opposing substrate 201 disposed above the display panel 101, and a sealing member 301, and may further include a first flexible circuit film 401, a second flexible circuit film 501, a third flexible circuit film 601, and a module member 701.

Initially, the display panel 101 will be described. The display panel 101 (e.g., the first substrate) may include light-emitting elements 190 each capable of emitting light, and may provide light required for displaying images. For example, the display panel 101 may be a display substrate including the light-emitting elements 190 each disposed in the respective pixels. The light-emitting elements 190 each disposed in the respective pixels may emit light independently of one another, thereby displaying images and representing colors.

A first base substrate 111 may provide a space where the light-emitting elements 190 and the like are disposed stably. The upper surface of the first base substrate 111 may be located in the plane where the first direction X and a second direction Y intersect with each other. The first base substrate 111 may be a transparent or opaque, insulating plate or insulating film. For example, the first base substrate 111 may include a glass material, a quartz material, etc. For another example, the first base substrate 111 may include a polymer material, such as any of an imide resin, a carbonate resin, and an acrylic resin.

In an exemplary embodiment, when viewed from the top, the first base substrate 111 may include a main part 111a having a first maximum width $W_{111a}$ in the first direction X, a first protruding part 111b extended from the main part 111a in the second direction Y, and a second protruding part 111c extended from the main part 111a in the second direction Y and spaced apart from the first protruding part 111b in the first direction X. The first protruding part 111b of the first base substrate 111 may have a second maximum width $W_{111b}$ in the first direction X, and the second protruding part 111c thereof may have a third maximum width $W_{111c}$ in the first direction X. Each of the second maximum width $W_{111b}$ and the third maximum width $W_{111c}$ may be smaller than the first maximum width $W_{111a}$. For example, the sum of the second maximum width $W_{111b}$ and the third maximum width $W_{111c}$ may be smaller than the first maximum width $W_{111a}$. The second maximum width $W_{111b}$ of the first base substrate 111 may be either equal to or different from the third maximum width $W_{111c}$ of the first base substrate 111. In an embodiment, the first base substrate 111 may have a rectangular shape or a rectangular shape with rounded corners having a maximum length in the second direction Y that is longer than the length in the first direction X of the first base substrate 111, e.g., the first maximum width $W_{111a}$.

In an embodiment, the display area DA of the display device may be defined such that it at least partially overlaps the first protruding part 111b and the second protruding part 111c of the first base substrate 111. Pixels may be defined on some regions of the first protruding part 111b and the second protruding part 111c as well as the main part 111a of the first base substrate 111, such that the main part 111a, at least a region of each of the first protruding part 111b and the second protruding part 111c may be involved in displaying images and representing colors. The display area DA is formed in the regions adjacent to one side of the module member 701 and on the other side spaced apart from it in the first direction X, except for the region where the module member 701 to be described later is disposed, such that the area of the non-display area NA may be reduced and the area of the display area DA may be increased when viewed from the top.

One edge 121 of the first base substrate 111 may include a first edge 121b, a second edge 121a depressed inwardly than the first edge 121b, and a third edge 121c protruding outwardly than the second edge 121a.

The first edge 121b may refer to an edge of the first protruding part 111b of the first base substrate 111 that is extended in the first direction X. The second edge 121a may refer to an edge of the main part 111a of the first base substrate 111 that is extended in the first direction X. The third edge 121c may refer to an edge of the second protruding part 111c of the first base substrate 111 that is extended in the first direction X. The first protruding part 111b, the second protruding part 111c, and the second edge 121a of the first base substrate 111 together may form a bay.

In an exemplary embodiment, a shortest distance D1 from the first edge 121b to the display area DA in the second direction Y may be larger than the shortest distance D2 from the second edge 121a to the display area DA in the second direction Y. In addition, a shortest distance from the third edge 121c to the display area DA in the second direction Y may be larger than the shortest distance D2 from the second edge 121a to the display area DA in the second direction Y.

In an embodiment, as the shortest distance D1 from the first edge 121b to the display area DA is larger than a shortest distance D2 from the second edge 121a to the display area DA, the width of the extended portion of the sealing member 301 in the first direction X disposed on the first protruding part 111b (i.e., a first straight portion 311 described later) can be sufficiently obtained. In an embodiment, the light-emitting substrate pad portions 170 and 170a are not disposed between the second edge 121a and the sealing member 301, such that a space where the module member 701 is to be disposed may be obtained between the first protruding part 111b and the second protruding part 111c of the first base substrate 111.

A driving layer including a thin-film transistor 130, lines 136 and 136a, and light-emitting substrate pad portions 170 and 170a may be disposed on the first base substrate 111. Although only one thin-film transistor 130 is depicted in FIG. 2 for convenience of illustration, in some exemplary embodiments, the driving layer may further include a plurality of thin-film transistors (not shown) and/or auxiliary electrodes (not shown) forming capacitors.

The thin-film transistor 130 may be electrically connected to the light-emitting element 190. For example, the thin-film transistor 130 may be a driving transistor configured to control the amount of current supplied to the light-emitting element 190 in a pixel. It is, however, to be understood that the present disclosure is not limited thereto. The thin-film transistor 130 may be a switching transistor configured to control on/off states of a pixel.

The thin-film transistor 130 may include an active layer 131 that forms a channel, a gate electrode 135 that is a control terminal, a source electrode 137 that is an input terminal, and a drain electrode 139 that is an output terminal.

The active layer 131 may be disposed on the first base substrate 111. Although the active layer 131 is disposed directly on the first base substrate 111 in the example shown in FIG. 2 and the like, in another exemplary embodiment, one or more inorganic layer may be further disposed between the first base substrate 111 and the active layer 131. The active layer 131 may include a semiconductor material. For example, the active layer 131 may include polycrystalline silicon or may include an oxide semiconductor.

The gate electrode 135 may be disposed on the active layer 131. The gate electrode 135 may overlap with at least a part of the active layer 135 in a third direction Z. In an embodiment, the gate electrode 135 may include aluminum, molybdenum, copper, titanium, or an alloy thereof. The gate electrode 135 may be formed of a single layer or may have a stack structure including a plurality of layers. The gate electrode 135 may function as the control terminal of the thin-film transistor 130 to which a control signal is received. In an exemplary embodiment in which the thin-film transistor 130 is a driving transistor, the gate electrode 135 may be electrically connected to the output terminal of a switching transistor (not shown) that controls on/off states of a pixel. A first insulating layer 140 may be disposed between the active layer 131 and the gate electrode 135 to insulate one from another. The first insulating layer 140 may be a gate insulating layer. The first insulating layer 140 may include an inorganic insulating material. Examples of the inorganic insulating material include silicon nitride, silicon oxide, silicon oxynitride, and the like.

A source electrode 137 and a drain electrode 139 may be disposed on the gate electrode 135. The source electrode 137 and the drain electrode 139 may be electrically connected to the source region and the drain region of the active layer 131, respectively, and may be spaced apart from each other. In an embodiment, each of the source electrode 137 and the drain electrode 139 may include aluminum, molybdenum, copper, titanium, or an alloy thereof. Each of the source electrode 137 and the drain electrode 139 may be made up made of a single layer or may have a stack structure including multiple layers. The source electrode 137 may function as the input terminal of the thin-film transistor 130 where an input signal is received. The drain electrode 139 may function as the output terminal of the thin-film transistor 130 where an output signal is transmitted. In an exemplary embodiment in which the thin-film transistor 130 is a driving transistor, the source electrode 137 may be electrically connected to a supply voltage line (not shown) from which a supply voltage is applied, and the drain electrode 139 may be electrically connected to an anode of the light-emitting element 190.

An interlayer dielectric layer 160 including a second insulating layer 161 and a third insulating layer 163 may be disposed between the gate electrode 135 and the source electrode 137 and between the gate electrode 135 and the drain electrode 139. The interlayer dielectric layer 160 may isolate the gate electrode 135, the source electrode 137, the drain electrode 139, and auxiliary electrodes (not shown) from one another. Each of the second insulating layer 161 and the third insulating layer 163 may include an inorganic insulating material. Examples of the inorganic insulating material include silicon nitride, silicon oxide, silicon oxynitride, and the like.

The first line 136 and the second line 136a may be disposed on the second insulating layer 161.

The first and second lines may be located at least partially in the non-display area NA. Although not shown in the drawings, the lines 136 and 136a may be extended from the non-display area NA to the display area DA to transmit a signal provided from an external driving element to the driving transistor 130 or the like. For example, the lines 136 and 136a may be electrically connected to the light-emitting substrate pad portions 170 and 170a to transmit signals provided from the first and third flexible circuit films 401 and 601 to the display area DA.

The lines 136 and 136a may include a scan line to which a scan signal is applied, a data line to which a data signal is applied, a supply voltage line to which a supply voltage is applied, etc. Although the lines 136 and 136a are disposed on the same layer as a holding capacitor electrode (not shown) in the example shown in FIG. 2, the present disclosure is not limited thereto.

The light-emitting substrate pad portions 170 and 170a (e.g., the first and second pad portions 171) may be located in the non-display area NA. For example, the first pad portion 170 may be located only in the outer non-display area ONA.

In such case, the line 136 electrically connected to the first pad portion 170 may traverse the sealing area SA. In some exemplary embodiments, the light-emitting substrate pad portions 170 and 170a may include pad electrodes (pe). The plurality of pad electrodes may have an expanded area and may be electrically connected to the lines 136 and 136a through contact holes formed in the third insulating layer 163. It is, however, to be understood that the present disclosure is not limited thereto. In other exemplary embodiments, the ends of the lines 136 and 136a may be expanded to form the light-emitting substrate pads 170 and 170a for electrical connection.

The first pad portion 170 may be disposed adjacent to the edge 121 of the first base substrate 111 that is extended in the first direction X. In an exemplary embodiment, the light-emitting substrate pad portion 170 is disposed adjacent to the first edge 121b and the third edge 121c of the first base substrate 111 but may not be adjacent to the second edge 121a. That is, the light-emitting substrate pad portion 170 may be disposed between the first edge 121b and the sealing member 301 and between the third edge 121c and the sealing member 301 when viewed from the top, but not between the second edge 121a and the sealing member 301. By disposing the first pad portion 170 on the first protruding part 111b and the second protruding part 111c of the first base substrate 111 but not on the main part 111a, the shortest distance D2 from the second edge 121a to the display area DA may be reduced, and the area of the non-display area NA may be reduced. In addition, the space in which the module member 701 to be described later is disposed may be obtained. In addition, the second pad portion 171 may be disposed adjacent to the opposed edge of the first base substrate 111 that is spaced apart from the edge 121 of the first base substrate 111. The second pad portion 171 may be disposed in the non-display area NA of the display device 1. It is, however, to be understood that the present disclosure is not limited thereto. In an embodiment, the second pad portion 171 may be disposed in a part of the display area DA.

The first flexible circuit film 401 and the third flexible circuit film 601 connected to the light-emitting substrate pad portions 170 and 170a will be described later.

A passivation layer 181 may be disposed on the source electrode 137 and the drain electrode 139. The passivation layer 181 may cover the source electrode 137 and the drain electrode 139 to thereby prevent the source electrode 137 and the drain electrode 139 from coming in contact with the organic material.

A level difference cover layer 183 may be disposed on the passivation layer 181. The level difference cover layer 183 may at least partially reduce level differences created by the driving layer including the thin-film transistor 130 and the like and may provide a space where the light-emitting element 190 is to be disposed stably. A material of the level difference cover layer 183 is not particularly limited as long as it has an insulation property and can cover level differences. For example, the level difference cover layer 183 may include an organic material, such as any of an acrylic resin, an epoxy resin, an imide resin, a cardo resin, and an ester resin.

The light-emitting element 190 may be disposed on the level difference cover layer 183. The light-emitting element 190 may include an anode 191 (e.g., a lower electrode), a cathode 193 (e.g., an upper electrode) disposed on the anode 191, and an emissive layer 195 interposed between the anode 191 and the cathode 193. For example, the emissive layer 195 may be an organic emissive layer including an organic light-emitting material, and the light-emitting element 190 may be an organic light-emitting element. In an embodiment, the light-emitting element 190 may emit only blue light, only green light, only red light, or white light that is a mixture thereof depending on the material or the stack structure of the emissive layer 195.

The anode 191 may be a pixel electrode that is disposed in each pixel and receives a driving signal applied separately. The anode 191 may be electrically connected to the drain electrode 139 of the thin-film transistor 130 through a contact hole formed in the level difference cover layer 183 and the interlayer dielectric layer 160. The anode 191 may be a transparent electrode, an opaque electrode, or a stack of a transparent electrode and an opaque electrode. Examples of a material of the transparent electrode may include indium tin oxide (ITO), indium zinc oxide (IZO), zinc oxide, indium oxide, etc. Examples of a material of the opaque electrode may include lithium (Li), aluminum (Al), magnesium (Mg), silver (Ag), nickel (Ni), and chromium (Cr).

The cathode 193 may be a common electrode that overlaps with the anode 191 in the third direction Z and is disposed across pixels, instead of being disposed in each of the pixels. In other words, the plurality of light-emitting elements 190 disposed in different pixels may share the cathode 193. The cathode 193, like the anode 191, may be a transparent electrode, an opaque electrode, or a stack of a transparent electrode and an opaque electrode.

The emissive layer 195 may be interposed between the anode 191 and the cathode 193. The emissive layer 195 may generate light by recombining holes and electrons transferred from the anode 191 and the cathode 193, respectively. For example, the holes and the electrons are recombined in the emissive layer 195 to generate excitons, and the excitons relax from the excited state to the ground state to emit light. In an embodiment, the emissive layer 195 may include a material that phosphoresces or fluoresces only blue light, a material that phosphoresces or fluoresces only green light, and/or a material that phosphoresce or fluoresces only blue light.

Although not shown in the drawings, hole control auxiliary layers (not shown), such as a hole injection layer, a hole transport layer, and a hole blocking layer, electron control auxiliary layers (not shown), such as an electron injection layer, an electron transport layer, and an electron blocking layer, or a charge generating auxiliary layer (not shown) may be further disposed between the emissive layer 195 and the anode 191 and/or between the emissive layer 195 and the cathode 193, to improve the luminous efficiency of the light-emitting element 190.

In some exemplary embodiments, a pixel-defining layer 185 may be further disposed on the anode 191. The above-described emissive layer 195 and the cathode 193 may be disposed on the pixel-defining layer 185. The pixel-defining layer 185 may have openings when viewed from the top, in each of which a part of the anode 191 is exposed. The pixel-defining layer 185 may isolate the anode 191 from the cathode 193 and partition a plurality of pixels. The pixel-defining layer 185 may include an organic material, such as any of an acrylic resin, an epoxy resin, an imide resin, and an ester resin.

The opposing substrate 201 will now be described. The opposing substrate 201 (e.g., the second substrate) may be opposed to the display panel 101. For example, the opposing substrate 201 may be an encapsulating substrate that is disposed above the display panel 101 and encapsulates the light-emitting element 190 together with the sealing member 301, which will be described later. The opposing substrate 201 may include a second base substrate 211 and may further include a touch element layer 231.

The second base substrate 211 may encapsulate the light-emitting element 190 to prevent or substantially prevent damage to the light-emitting element 190 caused by air, moisture, or the like. The second base substrate 211 may be a transparent plate or a transparent film. For example, the second base substrate 211 may include a glass material, a quartz material, etc. In some exemplary embodiments, the second base substrate 211 is spaced apart from the light-emitting element 190, and the space therebetween may be filled with an inert gas, such as nitrogen gas. It is, however, to be understood that the present disclosure is not limited thereto. In an embodiment, the space between the second base substrate 211 and the light-emitting element 190 may be filled with a filler or the like.

In an exemplary embodiment, when viewed from the top, the second base substrate 211 may include a main part 211a having a fourth maximum width $W_{211a}$ in the first direction X, a first protruding part 211b extended from the main part 211a in the second direction Y, and a second protruding part 211c extended from the main part 211a in the second direction Y and spaced apart from the first protruding part 211b in the first direction X. The first protruding part 211b of the second base substrate 211 may have a fifth maximum width $W_{211b}$ in the first direction X, and the second protruding part 211c thereof may have a sixth maximum width $W_{211c}$ in the first direction X. Each of the fifth maximum width $W_{211b}$ and the sixth maximum width $W_{211c}$ may be smaller than the fourth maximum width $W_{211a}$. For example, the sum of the fifth maximum width $W_{211b}$ and the sixth maximum width $W_{211c}$ may be smaller than the fourth maximum width $W_{211a}$. The fifth maximum width $W_{211b}$ of the second base substrate 211 may be either equal to or different from the sixth maximum width $W_{211c}$ of the second base substrate 211. In an embodiment, the second base substrate 211 may have a shape having a maximum length in the second direction Y that is longer than the length in the first direction X of the second base substrate 211, e.g., the fourth maximum width $W_{211a}$.

In an embodiment, the area of the second base substrate 211 may be smaller than the area of the first base substrate 111 when viewed from the top.

For example, the main part 111a of the first base substrate 111 may overlap with the main part 211a of the second base substrate 211 in the third direction Z. In an embodiment, the main part 111a of the first base substrate 111 may have substantially the same shape and area as the main part 211a of the second base substrate 211. For example, the maximum width $W_{111a}$ in the first direction X and the length in the second direction Y of the main part 111a of the first base substrate 111 may be substantially the same as the maximum width $W_{211a}$ in the first direction X and the length in the second direction Y of the main part 211a of the second base substrate 211, respectively.

The first protruding part 111b of the first base substrate 111 may overlap with the first protruding part 211b of the second base substrate 211 in the third direction Z, and the second protruding part 111c of the first base substrate 111 may overlap with the second protruding part 211c of the second base substrate 211 in the third direction Z. In an embodiment, the first protruding part 111b of the first base substrate 111 may have a larger area than the first protruding part 211b of the second base substrate 211, and the second protruding part 111c of the first base substrate 111 may have a larger area than the second protruding part 211c of the second base substrate 211 when viewed from the top.

In an exemplary embodiment, the second maximum width $W_{111b}$ of the first protruding part 111b of the first base substrate 111 in the first direction X may be substantially equal to the fifth maximum width $W_{211b}$ of the first protruding part 211b of the second base substrate 211 in the first direction X. A length $L_{111b}$ of the first protruding part 111b of the first base substrate 111 in the second direction Y may be greater than a length $L_{211b}$ of the first protruding part 211b of the second base substrate 211 in the second direction Y.

Likewise, the third maximum width $W_{111b}$ of the second protruding part 111c of the first base substrate 111 in the first direction X may be substantially equal to the sixth maximum width $W_{211c}$ of the second protruding part 211c of the second base substrate 211 in the first direction X, and a length $L_{111b}$ of the protruding part 111c of the first base substrate 111 in the second direction Y may be greater than a length $L_{211c}$ of the second protruding part 211c of the second base substrate 211 in the second direction Y.

The light-emitting substrate pad portion 170 may be disposed on the first protruding part 111b and the second protruding part 111c of the first base substrate 111 that are not covered by the first protruding part 211b and the second protruding part 211c of the second base substrate 211, respectively.

The display area DA of the display device 1 may be defined such that it at least partially overlaps the first protruding part 211b and the second protruding part 211c of the second base substrate 211. That is, pixels are defined in the first protruding part 211b and the second protruding part 211c in addition to the main part 211a of the second base substrate 211, and they may be involved in displaying images and representing colors. In an embodiment, the display area DA is formed on one side of the module member 701 and on the other side spaced apart from it in the first direction X, except for the region where the module member 701 is disposed, such that the area of the non-display area NA may be reduced and the area of the display area DA may be increased when viewed from the top.

In an embodiment, an edge 221 (e.g., the lower edge in FIG. 5) of the second base substrate 211 that is extended in the first direction X may have an atypical shape including a bay, notch, or trench when viewed from the top. For example, the edge 221 of the second base substrate 211 may be partially depressed inwardly. In an embodiment, the edge 221 of the second base substrate 211 may include a fourth edge 221b, a fifth edge 221a depressed inwardly than the fourth edge 221b, and a sixth edge 221c protruding more outwardly than the fifth edge 221a.

The fourth edge 221b may refer to an edge of the first protruding part 211b of the second base substrate 211 that is extended in the first direction X. The fifth edge 221a may refer to an edge of the main part 211a of the second base substrate 211 that is extended in the first direction X. The sixth edge 221c may refer to an edge of the second protruding part 211c of the second base substrate 211 that is extended in the first direction X. The first protruding part 211b, the second protruding part 211c, and the fifth edge 221a of the second base substrate 211 together may form a bay.

In an exemplary embodiment, a shortest distance D4 from the fourth edge 221b to the display area DA in the second direction Y may be larger than a shortest distance D5 from the fifth edge 221a to the display area DA in the second direction Y. In addition, a shortest distance from the sixth edge 221c to the display area DA in the second direction Y may be larger than the shortest distance D5 from the fifth edge 221a to the display area DA in the second direction Y. In some exemplary embodiments, the shortest distance D1 from the first edge 121b to the display area DA may be greater than the shortest distance D4 from the fourth edge 221b to the display area DA. In an embodiment, the shortest distance D2 from the second edge 121a to the display area DA may be substantially the same as the shortest distance D5 from the fifth edge 221a to the display area DA.

In an embodiment, as the shortest distance D4 from the fourth edge 221b to the display area DA is larger than the shortest distance D5 from the fifth edge 221a to the display area DA, the width of the extended portion of the sealing member 301 in the first direction X disposed on the first protruding part 211b (i.e., the first straight portion 311 described later) may be sufficiently obtained.

In an embodiment, the first edge 121b of the first base substrate 111 protrudes more than the fourth edge 221b of the second base substrate 211 such that the light-emitting pad portions 170 are disposed on the protruding region, and the second edge 121a of the first base substrate 111 is aligned with the fifth edge 221a of the second base substrate 211, such that the area occupied by the light-emitting substrate pad portions 170 may be reduced and the area of the non-display area NA may be further reduced.

In an embodiment, the display device may further include the first flexible circuit film 401, the second flexible circuit film 501, the third flexible circuit film 601, and the module member 701.

The first pad portion 170 of the display panel 101 may be connected to the first flexible circuit film 401, the second pad portion 171 may be connected to the second flexible circuit film 501, and the third flexible circuit film 601 may be connected to a touch pad portion 271 of the opposing substrate 201. In the example shown in FIG. 2, on the light-emitting substrate, the first pad portion 170 is connected to the first flexible circuit film 401 via a first anisotropic conductive film 490, the second pad portion 171 is connected to the second flexible circuit film 501 via a second anisotropic conductive film 590, and the touch pad unit 271 is connected to the third flexible circuit film 601 via a third anisotropic conductive film 690. It is, however, to be understood that the present disclosure is not limited thereto. FIG. 1 shows that the first to third flexible circuit films 401 to 601 are unfolded for convenience of illustration. However, each of the first to third flexible circuit films 401 to 601 may be bent toward the rear face of the display panel 101 and coupled to it.

The first flexible circuit film 401 may be flexible and may be bent in the second direction Y. The first flexible circuit film 401 may include a first base film 411 having insulation properties, a driving member 800 disposed on the first base film 411, and a pressure control member 900. In an exemplary embodiment, the first flexible circuit film 401 may be a flexible printed circuit board (FPCB). It is, however, to be understood that the present disclosure is not limited thereto. In another exemplary embodiment, the first flexible circuit film 401 may include a chip-on film package, and the chip-on film package may be connected to a separate flexible circuit board (not shown). In an embodiment, the pressure control member 900 may be disposed on a separate flexible circuit board (not shown) coupled to the first flexible circuit film 401 and extended outwardly from the first flexible circuit film 401.

The first flexible circuit film 401 may receive a driving signal for driving the display panel 101 from an external circuit through a signal line (not shown) and may transmit the driving signal to the driving transistor 130. The driving transistor 130 may generate an image signal based on the driving signal and may transmit the image signal to the plurality of pixels PX included in the display panel 101 so that the display panel 101 can display an image.

The first flexible circuit film 401 may include a first region and a second region. The first region may refer to a region that is adjacent to the other surface of the display panel 101 on one side and connected to the upper surface of the display panel 101 on the side at the side of the display panel 101. The first region may coincide with the region of the first base film 411 of the first flexible circuit film 401 except the second region. The second region may protrude from the first region of the display panel in the second direction Y. The width of the first region in the first direction X may be, but is not limited to being, larger than the width of the second region in the first direction X. The first flexible circuit film 401 may include in the first direction X a first longer side 421 including first to third sides 421*a* to 421*c*, and a second longer side 422 opposed to the first longer side 421. In addition, the first flexible circuit film 401 may include a first shorter side 423 bent from the right side of the first longer side 421 and extended in the second direction Y, and a second shorter side 424 opposed to the first shorter side 423. The widths of the first side 421*a* and the third side 421*c* in the first direction X may be smaller than the width of the second side 421*b*. In an embodiment, the sum of the widths of the first side 421*a* and the third side 421*c* in the first direction may be smaller than the width of the second side 421*b*. That is, the second side 421*b* may protrude from the first side 421*a* and the third side 421*c* in the second direction Y, and the first longer side 421 may have a shape generally depressed inwardly from the second side 421*b* in the second direction Y. A trench or a bay of the first flexible circuit film 401 may be formed by the regions of the first flexible circuit film 401 protruding in the second direction Y (for example, the first region, the second region) and the second side 421*b*. The module member 701 may be disposed in the trench or bay. In an embodiment, the region that is disposed on the right side of the first flexible circuit film 401 in the drawing and protrudes downwardly in the second direction Y (for example, the first region) may overlap with the first protruding part 111*b* of the first base substrate 111 and may have the same shape as the first protruding part 111*b*. The region that is disposed on the left side of the first flexible circuit film 401 in the drawing and protrudes downwardly in the second direction Y (for example, the second region) may overlap with the second protruding part 111*c* of the first base substrate 111 and may have the same shape as the second protruding part 111*c*.

As described above, in the display device 1 according to an exemplary embodiment of the present disclosure, the display area DA having the edge partially depressed inwardly is formed, and the module member 701 is disposed in the depressed portion. As a result, the thickness of the non-display area NA may be reduced when viewed from the top. Although the present disclosure is not limited thereto, even when the module member 701 has a relatively large thickness, a part of the edge of the first flexible circuit film 401 bent toward the rear face of the display panel 101 is depressed inwardly, such that the module member 701 does not overlap with the first flexible circuit film 401 in the third direction Z. As a result, the thickness of the display device 1 may be reduced.

The first flexible circuit film 401 may include a bridge 402*a* extended upwardly from a portion of the second longer side 422 in the second direction Y with a width (e.g., a predetermined width). For example, the bridge 402*a* may be the protruding region of the relative right region of the bent first flexible circuit film 401 in the second direction Y, and may be extended in the second direction Y, to be coupled with one region of the second flexible circuit film 501. It is, however, to be understood that the present disclosure is not limited thereto. The bridge 402*a* may be the protruding region of the relative left region or the center region of the bent first flexible circuit film 401 in the second direction Y.

Although the bridge 402*a* of the first flexible circuit film 401 is disposed on the upper surface of the second flexible circuit film 501 and overlaps with a portion of the second flexible circuit film 501 in the thickness direction in the example shown in FIG. 3, the present disclosure is not limited thereto. In an embodiment, the second flexible circuit film 501 may be disposed on the upper surface of the bridge 402*a* of the first flexible circuit film 401 and may overlap with a portion of the second flexible circuit film 501 in the thickness direction. In addition, a coupling layer or other element may be interposed between the bridge 402*a* of the first flexible circuit film 401 and the second flexible circuit film 501 overlapping in the thickness direction such that they are coupled with each other. For example, the bridge 402*a* and the second flexible circuit film 501 may be coupled with each other by an anisotropic conductive film (ACF). In an embodiment, an anisotropic conductive film (ACF) may be attached between the second flexible circuit film 501 and the bridge 402*a*, and they may be attached together by applying pressure and heat. In such case, the bridge 402*a* of the first flexible circuit film 401 may be directly connected to the second flexible circuit film 501. It is, however, to be understood that the present disclosure is not limited thereto. The end of the bridge 402*a* adjacent to the second flexible circuit film 501 may have a connector 452 as shown in the drawings, and the connector 452 may be fastened to a connector 551 of the second flexible circuit film 501.

On the first flexible circuit film 401, the driving member 800 connected to the pad portion 170 of the light-emitting substrate, an external control device for transmitting data signals including image data and control data to the driving member 800, a power supply, and the like may be disposed. In an exemplary embodiment, the driving member 800 is a driving IC, but the present disclosure is not limited thereto. Further, a pressure control member 900 capable of controlling the pressure sensing member PS may be further disposed on the first flexible circuit film 401. The pressure control member 900 may be disposed on the first flexible circuit film 401 such that it is spaced apart from the driving IC. In other implementations, however, the driving member 800 and the pressure control member 900 may be implemented as a single chip.

In an exemplary embodiment, on the bridge 402*a* of the first flexible circuit film 401, a signal line is disposed that connects the pressure control member 900 on the first flexible circuit film 401 from the pressure sensing member PS mounted on the second flexible circuit film 501 to be described below. The signal line includes a conductive material, such as any of gold (Au), silver (Ag), aluminum (Al), molybdenum (Mo), chromium (Cr), titanium (Ti), nickel (Ni), neodymium (Nd), copper (Cu) and platinum (Pt).

The second flexible circuit film 501 may include a third longer side 505 extended in the first direction X and a fourth longer side 506 opposing the third longer side 505, and may have a third shorter side 507 bent from the right side of the fourth longer side 505 and extended downwardly in the second direction Y and a fourth shorter side 508 opposing the third shorter side 507. The second flexible circuit film 501 may be flexible and may be bent in the second direction Y. The second flexible circuit film 501 may be bent toward the rear face of the first base substrate 111 and may be disposed above the front face of the first base substrate 111 in the drawings. The second flexible circuit films 501 may be bent toward the front face of the first base substrate 111 and may be coupled to each other by, for example, an anisotropic conductive film (ACF).

The second flexible circuit film 501 may include a second base film 511 having insulation properties, a shielding electrode 520 disposed on the second base film 511, a plurality of conductive patterns including a pressure electrode 540, and a plurality of insulating layers stacked on one another. The above-described conductive patterns and insulating layers will be described later with reference to FIG. 6.

Although the bridge 402*a* is formed integrally with the first flexible circuit film 401 in the above exemplary embodiment, the present disclosure is not limited thereto. Although not shown in the drawings, the second flexible circuit film 501 may have a bridge that has a width (e.g., a predetermined width) and protrudes in the second direction Y from the left or right side or the center region of the third longer side 505, and the bridge of the second flexible circuit film 501 may be fastened to the first flexible circuit film 401. In an embodiment, the bridge 402*a* may be formed integrally with the second flexible circuit film 501. It is, however, to be understood that the present disclosure is not limited thereto. In an embodiment, the first flexible circuit film 401, the second flexible circuit film 501, and the bridge 402*a* may be formed integrally and may be bent toward the rear face of the first base substrate 111 to be coupled with it. In such case, it can be said that the first flexible circuit film 401 includes the second flexible circuit film 501 and the bridge. The first flexible circuit film 401 may be coupled with the pad portion 170 of the light-emitting substrate and may be bent toward the rear face of the first base substrate 111 to be coupled with it.

The third flexible circuit film 601 may be flexible and bent in the bending direction, e.g., the third direction Z. The third flexible circuit film 601 may include a third base film 611 having insulation properties and conductive patterns (not shown) disposed on the third base film 611. In some exemplary embodiments, the third flexible circuit film 601 may further include a connector 651, and the connector 651 of the third flexible circuit film 601 may be connected to a connector 451 of the first flexible circuit film 401. It is, however, to be understood that the present disclosure is not limited thereto. In an embodiment, the first flexible circuit film 401 and the third flexible circuit film 601 may be coupled with each other by an anisotropic conductive film (ACF). In such case, the first flexible circuit film 401 may be directly connected to the third flexible circuit film 601.

In an embodiment, the module member 701 may have an optical sensing feature and/or a speaker feature. For example, the module member 701 may be an optical sensor module including a camera sensor for acquiring image information, an illuminance sensor for acquiring brightness information on the front surface of the display device 1 and/or a proximity sensor for acquiring information on the distance to an adjacent object or position of the adjacent object. Alternatively, the module member 701 may be a speaker module for modulating electrical signal into sound.

The module member 701 may be disposed on one side of the first base substrate 111 and the second base substrate 211 in the second direction Y. For example, the module member 701 may be disposed adjacent to the second edge 121*a* of the main part 111*a* of the first base substrate 111 and the fifth edge 221*a* of the main part 211*a* of the second base substrate 211. The module member 701 may be disposed between the first protruding part 111*b* and the second protruding part 111*c* of the first base substrate 111 and between the first protruding part 211*b* and the second protruding part 211*c* of the second base substrate 211.

Figure 6:
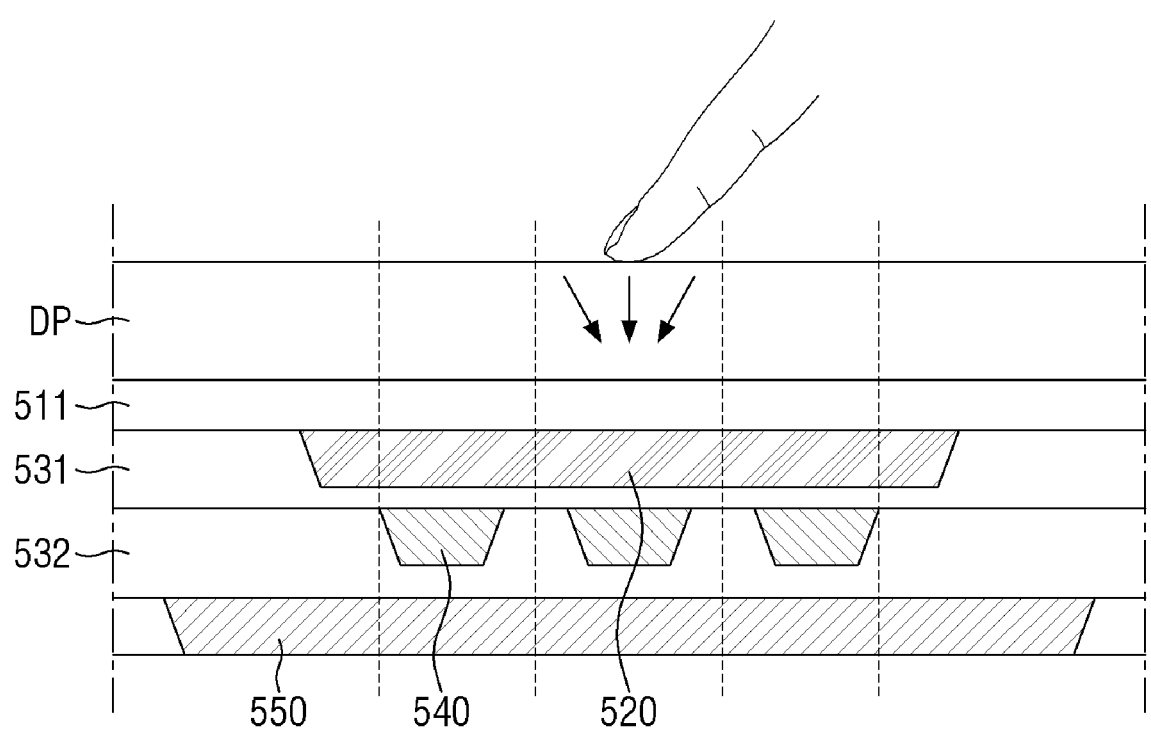
FIG. 6 is a cross-sectional view of a second flexible printed circuit board of the display device of FIG. 1.

FIG. 6 is a cross-sectional view of the second flexible printed circuit board of FIG. 1. In an exemplary embodiment, the pressure sensing member PS may be of a capacitive type.

The pressure sensing member PS may include a plurality of electrodes and a plurality of insulating layers.

In an embodiment, the pressure sensing member PS may include a shielding electrode 520, a first insulating layer, a pressure electrode 540, and a second insulating layer. In addition, the pressure electrode 540 may form a capacitance with the conductive material (electrode) of a bracket 550.

The pressure sensing member PS may be disposed on the second flexible circuit board 501. The shielding electrode 520 of the pressure sensing member PS is coupled on the second flexible printed circuit board 501 and can prevent or substantially prevent electrical interaction between the conductive patterns disposed on the display panel DP (e.g., the conductive layers of FIG. 2) and the pressure electrode 540 of the pressure sensing member PS. The shielding electrode 520 may be made of a transparent conductive material, such as any of indium tin oxide (ITO), indium zinc oxide (IZO), indium tin zinc oxide (ITZO), and Al-doped zinc oxide (AZO), and may be made of a same material as the pressure electrode 540 to be described below.

The shielding electrode 520 may be disposed between the pressure electrode 540 and the plurality of conductive patterns of the display panel DP and can block the pressure electrode 540 and the conductive patterns of the display panel DP from affecting each other. Specifically, by disposing the shielding electrode 520, it is possible to clearly distinguish the electric field formed by the pressure electrode 540 from the electric field formed by the plurality of conductive patterns of the display panel DP. As a result, it is possible to suppress the instability of the electric field that may occur between the pressure electrode 540 and the plurality of conductive patterns, and it is possible to accurately calculate the pressure data according to a pressure applied from the outside.

A first pressure insulating layer 531 may be disposed over the shielding electrode 520. The pressure electrode 540 can be protected from moisture, oxygen, and the like by the first pressure insulating layer 531. The first pressure insulating layer 531 may be made of an organic or inorganic insulating material.

The pressure electrode 540 may be disposed on the first pressure insulating layer 531. More than one pressure electrode 540 may be disposed. The pressure electrode 540 may include a conductive material. The conductive material may include a metal or an alloy thereof. Examples of the metal may include gold (Au), silver (Ag), aluminum (Al), molybdenum (Mo), chromium (Cr), titanium (Ti), nickel (Ni), neodymium (Nd), copper (Cu), platinum (Pt), etc. In an exemplary embodiment, the pressure electrode 540 may be made of a transparent conductive material. Examples of the transparent conductive material may include silver nanowire (AgNW), indium tin oxide (ITO), indium zinc oxide (IZO), antimony zinc oxide (AZO), indium tin zinc oxide (ITZO), zinc oxide (ZnO), and tin oxide ($SnO_2$), carbon nano tube, graphene, etc. The pressure electrode 540 may be made up of a single layer or multiple layers, and may include, for example, multiple layers of two or more of the above-listed materials.

Although three pressure electrodes 540 are depicted in the drawings, the number of the pressure electrodes 540 is not limited to three. In addition, although the pressure electrodes 540 are shown in a rectangular shape in the drawings, the shape is not limited thereto and may have any of various shapes. The number and arrangement of the pressure electrodes 540 may be variously changed depending on the shape and size of the display device, input means, etc.

The pressure electrodes 540 may form the capacitance with the bracket 550 to be described later. According to an exemplary embodiment of the present disclosure, the display device 1 may determine the intensity of a touch based on the amount of change in the capacitance between the pressure electrodes 540 and the bracket 550.

A second pressure insulating layer 532 may be disposed over the pressure electrodes 540. According to an exemplary embodiment of the present disclosure, the second pressure insulating layer 532 may be a dielectric layer such that it can form the capacitance between the pressure electrodes 540 and the bracket 550. The second pressure insulating layer 532 may be positioned between the pressure electrodes 540 and the bracket 550. In addition, the second pressure insulating layer 532 may be an elastic substance. In an embodiment, the second pressure insulating layer 532 may include one of polyimide, acrylic-based materials, urethane-based materials, Si-rubber-based materials, synthetic rubber, and synthetic resin. Further, the second insulating layer may be implemented as a foamed film (or a porous film) including a synthetic rubber or a synthetic resin. The synthetic rubber may include, for example, a material such as a nitrile or an acrylic rubber. The synthetic resin may include a polyolefin-based or polyester-based thermoplastic elastomer, and an ethylene-vinyl acetate copolymer. In addition, the synthetic resin may include a material in which a compounding agent of at least one of hard polymer, plasticizer, and softener is combined in a material having a rubber elasticity, such as polyurethane or polybutadiene or soft polyvinyl chloride.

The pressure electrode 540 and the bracket 550 form the capacitance with the second pressure insulating layer 532 therebetween, and, thus, the value of the capacitance may vary depending on the dielectric constant of the second pressure insulating layer 532.

According to an exemplary embodiment of the present disclosure, the bracket 550 may be disposed on the second pressure insulating layer 532. The bracket 550 may accommodate elements disposed thereon. The bracket 550 may include a bottom (not shown) and side walls (not shown). The bottom may have a flat shape. The side walls may be extended from the four sides of the bottom when viewed from the top, respectively, and may be inclined at an angle (e.g., a predetermined angle). The bracket 550 may surround and support the elements stacked thereon. For example, the bracket 550 may be a storage container or a protective container for accommodating other elements. The bracket 550 may accommodate a window (not shown), the opposing substrate 201, the display panel 101, the pressure sensing member PS, and the cover panel sheet (not shown). The bracket 550 may cover the elements by embracing them. The bottom of the bracket 550 faces the pressure sensing member PS. The pressure sensing member PS may be attached to the bottom of the bracket 550 by a coupling layer (not shown) such as an adhesive layer. According to an exemplary embodiment of the present disclosure, the coupling layer for attaching the pressure sensing member PS may be, but is not limited to, a waterproof tape.

The side walls of the bracket 550 may face the side walls of the touch panel, the display panel, the pressure sensing member PS, and a cover panel sheet (not shown). The upper ends of the side walls of the bracket 550 may face the window. The outer side surfaces of the bracket 550 may be aligned with the outer side surfaces of the window, respectively. The window may be attached to the bracket 550 by a waterproof tape (not shown).

The bracket 550 may form an electrode including a conductive material. The conductive material may include a metal or an alloy thereof. Examples of the metal may include gold (Au), silver (Ag), aluminum (Al), molybdenum (Mo), chromium (Cr), titanium (Ti), nickel (Ni), neodymium (Nd), copper (Cu), platinum (Pt), etc. The bracket 550 may be made of a same material as the conductive material forming the pressure electrode 540 or may be made of a different material.

Although the capacitive pressure sensing member PS is employed in the above-described exemplary embodiment, the present disclosure is not limited thereto. In some exemplary embodiments, a resistive pressure sensing member may be employed. When the resistive pressure sensing member PS is employed, a first base film (not shown) and a second base film (not shown) opposed to each other are included. Each of the first base film and the second base film may include a material such as polyethylene, polyimide, polycarbonate, polysulfone, polyacrylate, polystyrene, polyvinyl chloride, polyvinyl alcohol, poly(norbornene), and poly ester. It is, however, to be understood that the present disclosure is not limited thereto. In an embodiment, each of the first base film and the second base film may be made of a polyethylene terephthalate (PET) film or a polyimide film. A pattern of electrodes (not shown) may be formed on the upper surface of the first base film. A pressure sensing pattern (not shown) may be formed on the upper surface of the second base film. The first base film and the pattern of electrodes may be coupled with the second base film and the pressure sensing pattern by an adhesive material. The surface of the first base film refers to the surface facing the second base film. In an embodiment, the thickness of the electrode pattern may be in a range from 2 to 8 µm. For example, the thickness of the electrode pattern may be approximately 4 µm. The electrode pattern includes a plurality of driving electrodes (not shown) and sensing electrodes (not shown). They may be disposed closely but are spaced apart from one another so as not to create a short circuit.

In an embodiment, the driving electrodes and the sensing electrodes may be disposed on the same layer. In addition, they may be made of the same material. For example, they may include a conductive material, such as silver (Ag) and copper (Cu).

A pressure sensing pattern is disposed on a surface of the second base film. The surface of the second base film refers to the surface facing the first base film. The pressure sensing pattern may include a pressure-sensitive material. The pressure-sensitive material may include metal nanoparticles, such as any of nickel, aluminum, tin, and copper, or carbon. The pressure-sensitive material may be dispersed in a polymer resin in the form of particles. It is, however, to be understood that the present disclosure is not limited thereto. The electrical resistance of the pressure-sensing pattern decreases as the pressure increases. By using this characteristic, it is possible to sense whether a pressure is applied and the magnitude of the pressure, if so.

The surface of the pressure sensing pattern may be in contact with or at least adjacent to the surfaces of the driving electrodes and the sensing electrodes. When a pressure is applied to the pressure sensing member PS, the surface of the pressure sensing pattern is brought into contact with the driving electrodes and the sensing electrodes at that position. As a result, the driving electrodes and the sensing electrodes can be physically connected through the pressure sensing pattern. The pressure sensing pattern disposed between the driving electrodes and the sensing electrodes may function as an electrical resistance.

The touch element layer 231 including a touch electrode layer 240, a touch lines 251, and the touch pad portion 271 of the display device 1 according to an exemplary embodiment of the present disclosure will now be described with reference to FIGS. 7 to 10.

Figure 7:
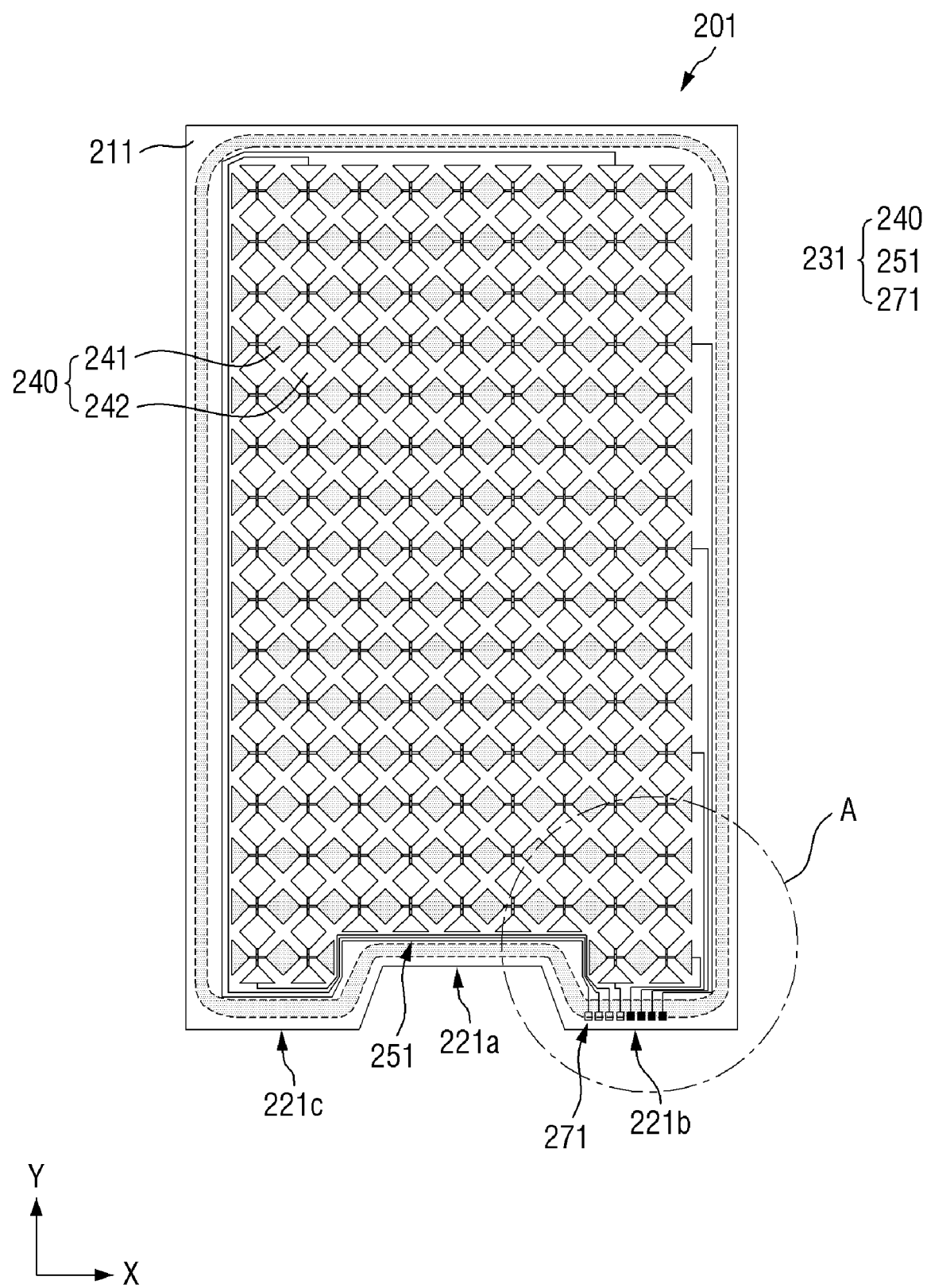
FIG. 7 is a plan view showing a touch element layer of the opposing substrate of FIG. 1.
Figure 8:
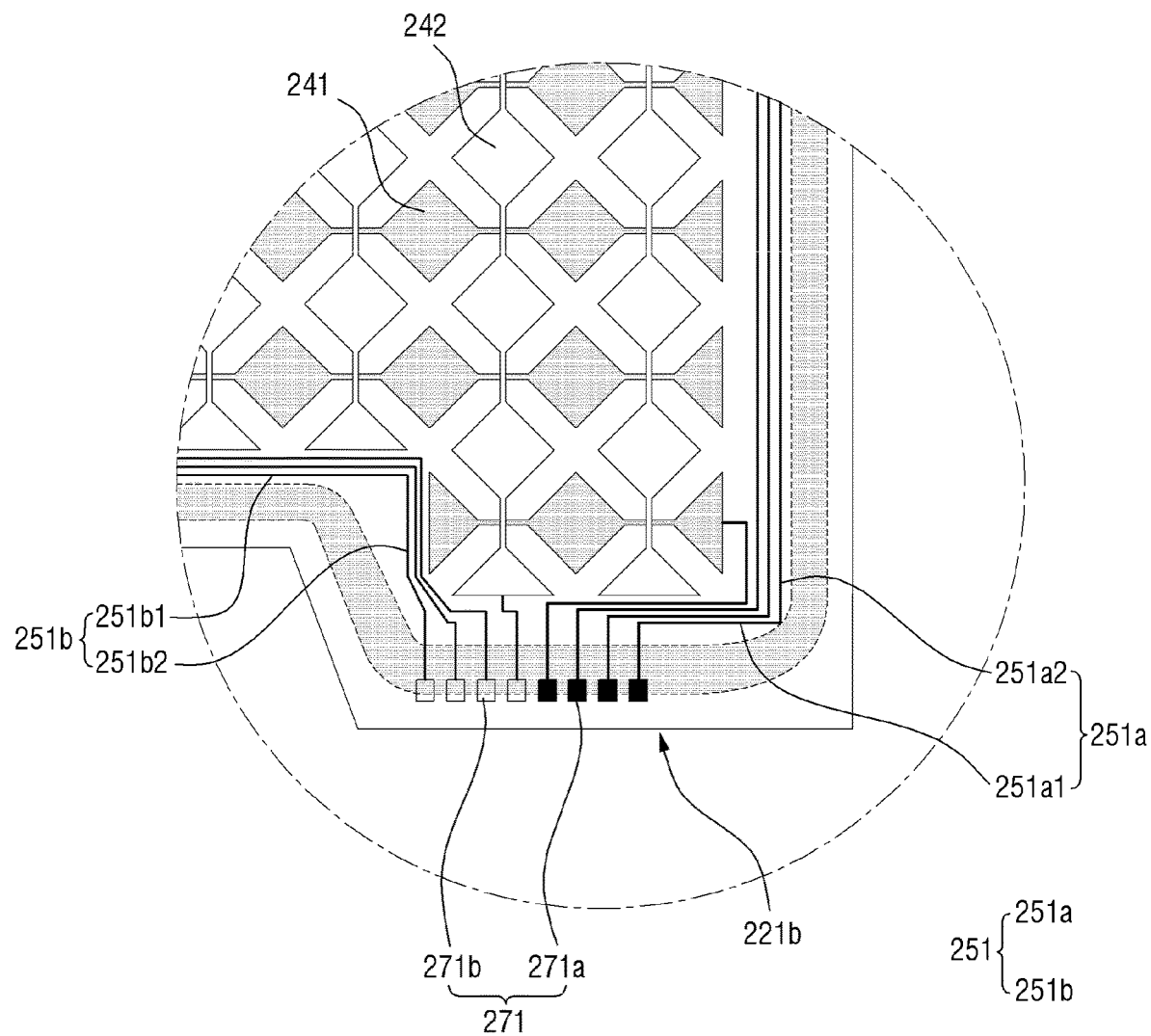
FIG. 8 is an enlarged view of a region "A" of FIG. 7.
Figure 9:
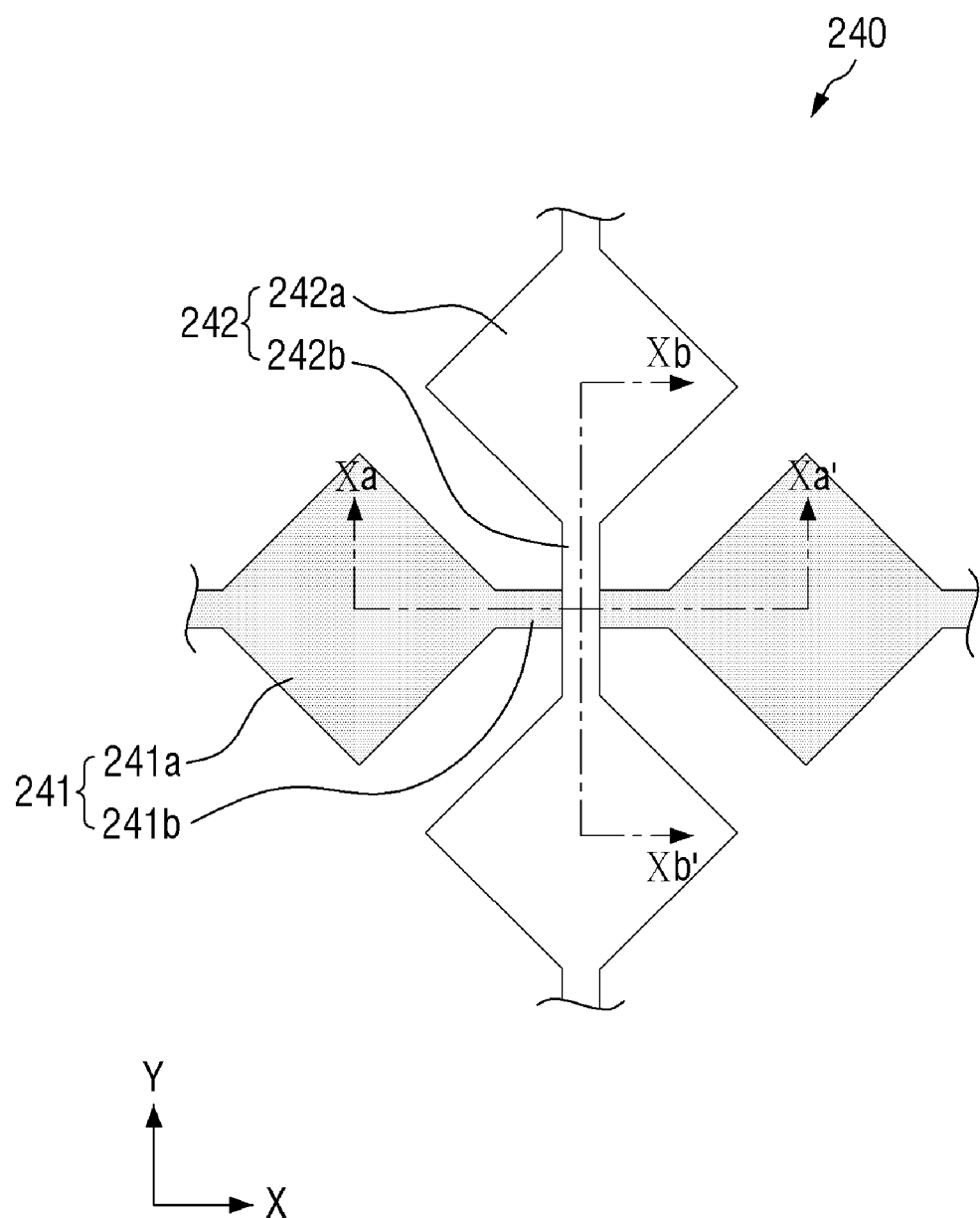
FIG. 9 is an enlarged view of a first touch electrode and a second touch electrode of FIG. 7.
Figure 10A:
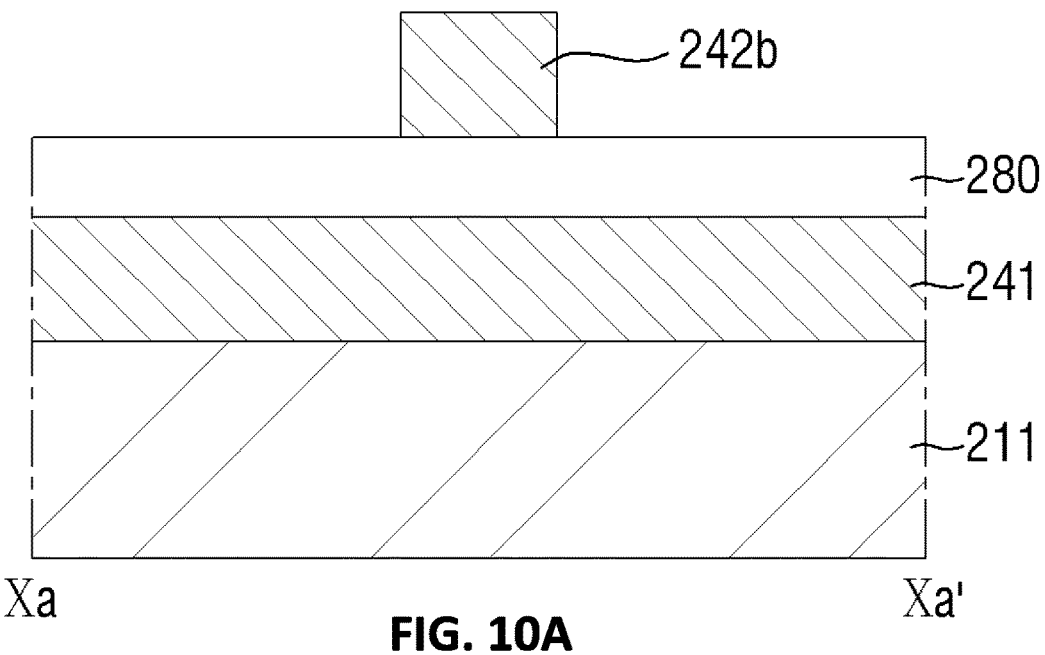
FIGS. 10A and 10B are a cross-sectional view taken along the line Xa-Xa' and a cross-sectional view taken along the line Xb-Xb' of FIG. 9, respectively.
Figure 10B:
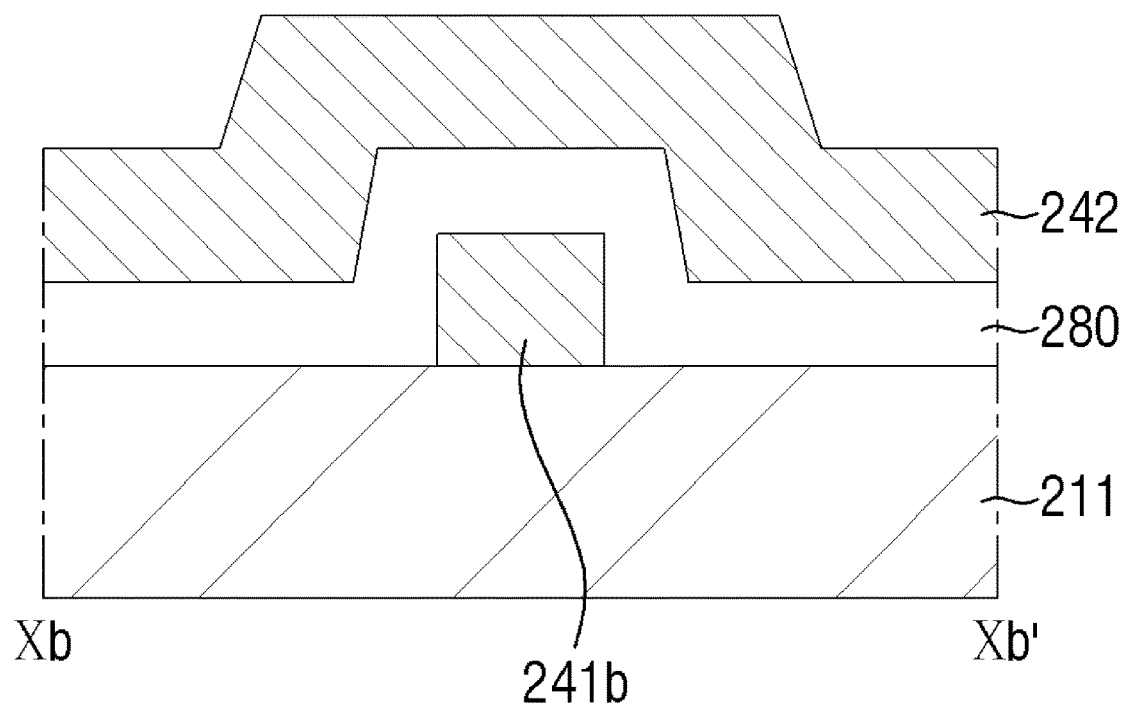

FIG. 7 is a plan view showing the touch element layer of the opposing substrate of FIG. 1; FIG. 8 is an enlarged view of a region "A" of FIG. 7; FIG. 9 is an enlarged view of a first touch electrode and a second touch electrode of FIG. 8; and FIGS. 10A and 10B are a cross-sectional view taken along the line Xa-Xa' and a cross-sectional view taken along the line Xb-Xb' of FIG. 9, respectively.

Referring to FIGS. 7 to 10, the touch element layer including the touch electrode layer, the touch lines, and the touch pad portion may be disposed on the upper surface of the second base substrate.

The touch electrode layer 240 may include first touch electrodes 241 extended in the first direction X and second touch electrodes 242 extended in the second direction Y. The first touch electrodes 241 and the second touch electrodes 242 may intersect each other. A fourth insulating layer 280 may be interposed between the first touch electrodes 241 and the second touch electrodes 242 to insulate one from another. The first insulating layer 280 may include an inorganic insulating material. Examples of the inorganic insulating material may include silicon nitride, silicon oxide, silicon nitride oxide, and silicon oxynitride.

The first touch electrodes 241 may be extended generally in the first direction X and may be spaced apart from one another in the second direction Y. The first touch electrodes 241 may be transparent electrodes. Each of the first touch electrodes 241 may include a plurality of first expanded portions 241*a* having a substantially diamond shape when viewed from the top, and first connecting portions 241*b* connecting adjacent ones of the first expanded portions 241*a* with one another. The first touch electrodes 241 may be sensing electrodes where a sensing signal is applied.

The second touch electrodes 242 may be extended generally in the second direction Y and may be spaced apart from one another in the first direction X. The second touch electrodes 242 may be transparent electrodes. Each of the second touch electrodes 242 may include a plurality of second expanded portions 242*a* having a substantially diamond shape when viewed from the top, and second connecting portions 242*b* connecting adjacent ones of the second expanded portions 242*a* with one another. The second touch electrodes 242 may be driving electrodes where a driving signal is applied.

In an exemplary embodiment where the first expanded portions 241*a* and the second expanded portions 242*a* have a diamond shape, they may be spaced apart from one another in a direction that their sides face each other, e.g., the diagonal direction crossing the first direction X and the second direction Y in the plane. In addition, the first connecting portions 241*b* and the second connecting portions 242*b* may be arranged such that they are insulated from each other. For example, the second connecting portion 242*b* extended in the second direction Y may be disposed above the first connecting portion 241*b* extended in the first direction X, and the fourth insulating layer 280 may be interposed between the first connecting portion 241*b* and the second connecting portion 242*b*.

A mutual capacitance may be formed between the first touch electrode 241 extended in the first direction X and the second touch electrode 242 extended in the second direction Y. When the capacitance between the first touch electrode 241 and the second touch electrode 242 is changed by a user's touch operation, the display device 1 can acquire the coordinate information of the touch operation based on the changed capacitance. That is, the touch element layer 231 of the opposing substrate 201 can acquire the coordinate information of the touch operation.

The touch lines 251 may be extended from the non-display area NA, e.g., the inner non-display area INA and may transmit a signal provided from an external driving element to the touch electrode layer 240. For example, the touch lines 251 may be electrically connected to the touch pad portion 271 to transmit a signal provided from the second flexible circuit film 501 to the touch electrode layer 240. The touch lines 251 may include first touch lines 251a connected to the first touch electrodes 241 and second touch lines 251b connected to the second touch electrodes 242.

The first touch lines 251a may include first portions 251a1 extended in the first direction X and second portions 251a2 extended in the second direction Y. Further, the second touch lines 251b may include first portions 251b1 extended in the first direction X and second portions 251b2 extended in the second direction Y. In the exemplary embodiment, the first touch lines 251a and the second touch lines 251b may be located at least partially within the non-display area NA. For example, the first portions 251b1 of the second touch lines 251b may be located only inside the sealing member 301 when viewed from the top.

The touch pad portion 271 (e.g., the third pad portion) may be located in the non-display area NA. For example, the touch pad portion 271 may be located at least partially in the outer non-display area ONA. More specifically, for example, the touch pad portion 271 may not be located in the inner non-display area INA and may overlap with the outer non-display area ONA at least partially and with the sealing area SA at least partially. In such case, the touch lines 251 may be disposed such that they traverse the sealing area SA at least partially. In an embodiment, as the touch pad portion 271 is not disposed in the inner non-display area INA, the area occupied by the inner non-display area INA when viewed from the top may be reduced.

The touch pad unit 271 may include first pad electrodes 271a connected to the first touch lines 251a and second pad electrodes 271b connected to the second touch lines 251b, respectively. It is, however, to be understood that the present disclosure is not limited thereto. In other exemplary embodiments, the ends of the first touch lines 251a and the second touch lines 251b may be expanded to form touch pad portion 271 for electrical connection.

Although the present disclosure is not limited thereto, the display panel 101 including the light-emitting elements 190 and the opposing substrate 201 including the touch element layer 231 may be fabricated separately and then may be coupled with each other by using the sealing member 301. At this time, the portions of the touch lines 251a1 and 251b1 which are adjacent to the sealing member 301 extended in the first direction X and extended in the first direction X and the portions of the touch lines 251a2 and 251b2 which are adjacent to the sealing member 301 extended in the second direction Y and extended in the second direction Y may be disposed more to the inside than the sealing member 301. As a result, it is possible to allow a laser to transmit from the opposing substrate 201 toward the sealing member 301 and, thus, the sealing member 301 can be cured with the laser.

In addition, the touch pad portion 170 may be disposed adjacent to the edge 221 of the second base substrate 211 that is extended in the first direction X. In an exemplary embodiment, the touch pad portion 271 including the first pad electrodes 271a and the second pad electrodes 271b is disposed adjacent to the fourth edge 221b of the second base substrate 211, but neither to the fifth edge 221a nor to the sixth edge 221c. The touch pad portion 271 including the first pad electrodes 271a and the second pad electrodes 271b is disposed on the first protruding part 211b of the second base substrate 211, and not on the main part 211a and the second protruding portion 211c, the connection structure of the second flexible circuit film 501 can be simplified, and the area of the non-display area NA can be reduced. In addition, the space in which the module member 701 is disposed can be obtained.

As described above, the pressure sensing member PS disposed on the second flexible circuit board may be connected to the pressure control member 900 disposed on the first flexible circuit board 401 through a conductive line (not shown). The conductive line may be disposed on the bridge 402a described above. In such case, with reference to FIG. 3, the pressure sensing member PS may be disposed adjacent to the upper edge of the rear face of the light-emitting substrate and spaced apart from the lower edge where the first flexible circuit board 401 is disposed. By disposing the pressure sensing member PS at the upper edge in this manner, the user interface can be improved. Specifically, a user may apply a pressure to the display device, specifically, the pressure sensing member PS. When the user's input is applied, it can be determined whether the pressure is applied at a position, and the magnitude of the pressure, if so, can be calculated by the pressure control member 900 electrically connected to the pressure sensing member PS through the conductive line.

If the pressure sensing member is disposed on the first flexible circuit board 401 disposed at the lower edge of the display device in the drawings, the user has to press the lower edge of the display device when she/he applies a pressure to achieve a desired operation of the display device. In doing so, however, the user may erroneously press another region (for example, a module region) adjacent to the pressure sensing member instead of the pressure sensing member, which deteriorates the user convenience. Further, since a user applies a pressure using her/his finger or other object while gripping the display device with the palm of the hand to apply the input, if the pressure sensing member is disposed at the lower edge of the display device, the center of gravity is formed upwardly (toward the module) when she/he uses the smartphone, such that it is inconvenient for the user to grip the smartphone. Further, in this case, the screen of the smartphone is hidden by the hand, and it is inconvenient for the user to see the screen.

In contrast, according to the above-described exemplary embodiment of the present disclosure, the pressure sensing member PS is disposed adjacent to the upper edge of the rear face of the light-emitting substrate and is disposed apart from the lower edge where the first flexible circuit board 401 is disposed, such that the above-described issues are overcome and the user interface can be improved.

Herein, some other exemplary embodiments of the present disclosure will be described. The description of substantially same elements as in the above-described embodiment will be omitted, which will be clearly understood by those skilled in the art from the accompanying drawings.

Figure 11:
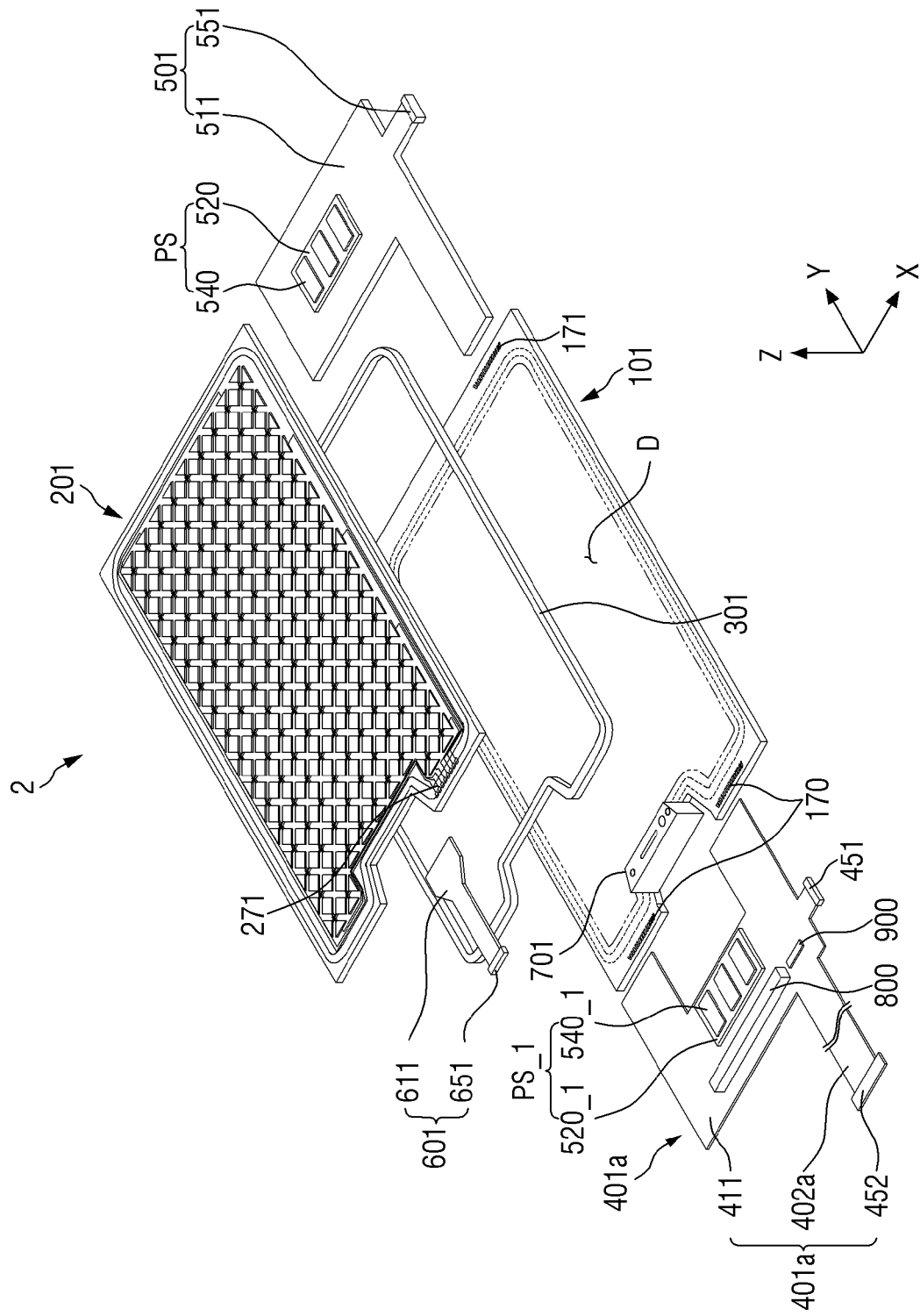
FIG. 11 is an exploded, perspective view of a display device according to another exemplary embodiment of the present disclosure.
Figure 12:
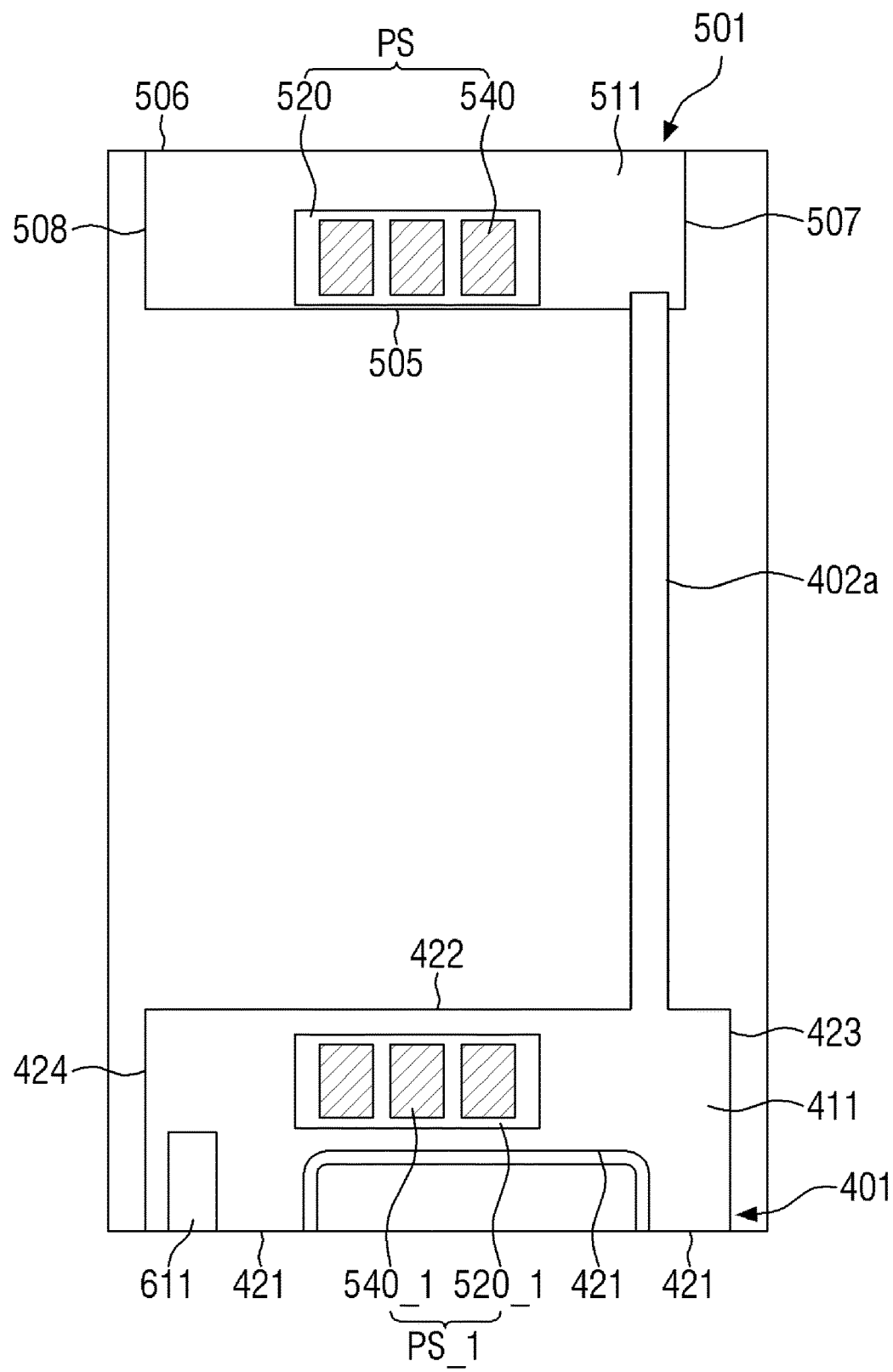
FIG. 12 is a view showing the layout of the display device of FIG. 11.

FIG. 11 is an exploded, perspective view of a display device according to another exemplary embodiment of the present disclosure; and FIG. 12 is a view showing the layout of the display device of FIG. 11.

A display device 2 according to another exemplary embodiment of FIGS. 11 and 12 is substantially the same as the display device 1 according to the exemplary embodiment of FIGS. 1 to 10 except that the former further includes a pressure sensing member PS_1 on a first flexible circuit board 401a.

More specifically, according to this exemplary embodiment, a pressure sensing member PS_1 may be disposed on the first flexible circuit film 401a in addition to the pressure sensing member PS disposed on the second flexible circuit film 501. One end of the pressure sensing member PS_1 may include a signal line electrically connected to the pressure control member 900 on the first flexible circuit film 401a. In an embodiment, the pressure sensing member PS_1 may have the same structure as the pressure sensing member PS and may include a shielding electrode 520_1 and a pressure electrode 540_1. For example, the pressure sensing member PS_1 may be a capacitive pressure sensing member. In such case, the pressure sensing member PS_1 may have the same structure as the pressure sensing member PS. It is, however, to be understood that the present disclosure is not limited thereto. The pressure sensing member PS_1 may be a resistive pressure sensing member as described above. Also in such case, a user may apply a pressure to the pressure sensing member PS_1. When the user's input is applied, it can be determined whether the pressure is applied at a position, and the magnitude of the pressure, if so, can be calculated by the pressure control member 900 electrically connected to the pressure sensing member PS_1 through the conductive line.

If the pressure sensing member is disposed on the first flexible circuit board 401a disposed at the lower edge of the display device in the drawings, the user has to press the lower edge of the display device when she/he applies a pressure to achieve a desired operation of the display device. In doing so, however, the user may erroneously press another region (for example, a module region) adjacent to the pressure sensing member instead of the pressure sensing member, which deteriorates the user convenience. Further, since a user applies a pressure using her/his finger or other object while gripping the display device with the palm of the hand to apply the input, if the pressure sensing member is disposed at the lower edge of the display device, the center of gravity is formed upwardly (toward the module) when she/he uses the smartphone, such that it is inconvenient for the user to grip the smartphone. Further, in this case, the screen of the smartphone is hidden by the hand, and it is inconvenient for the user to see the screen.

In contrast, according to the above-described exemplary embodiment of the present disclosure, the pressure sensing member PS_1 is disposed adjacent to the upper edge of the rear face of the light-emitting substrate and is disposed apart from the lower edge where the first flexible circuit board 401a is disposed, such that the above-described issues are overcome and the user interface can be improved.

Figure 13:
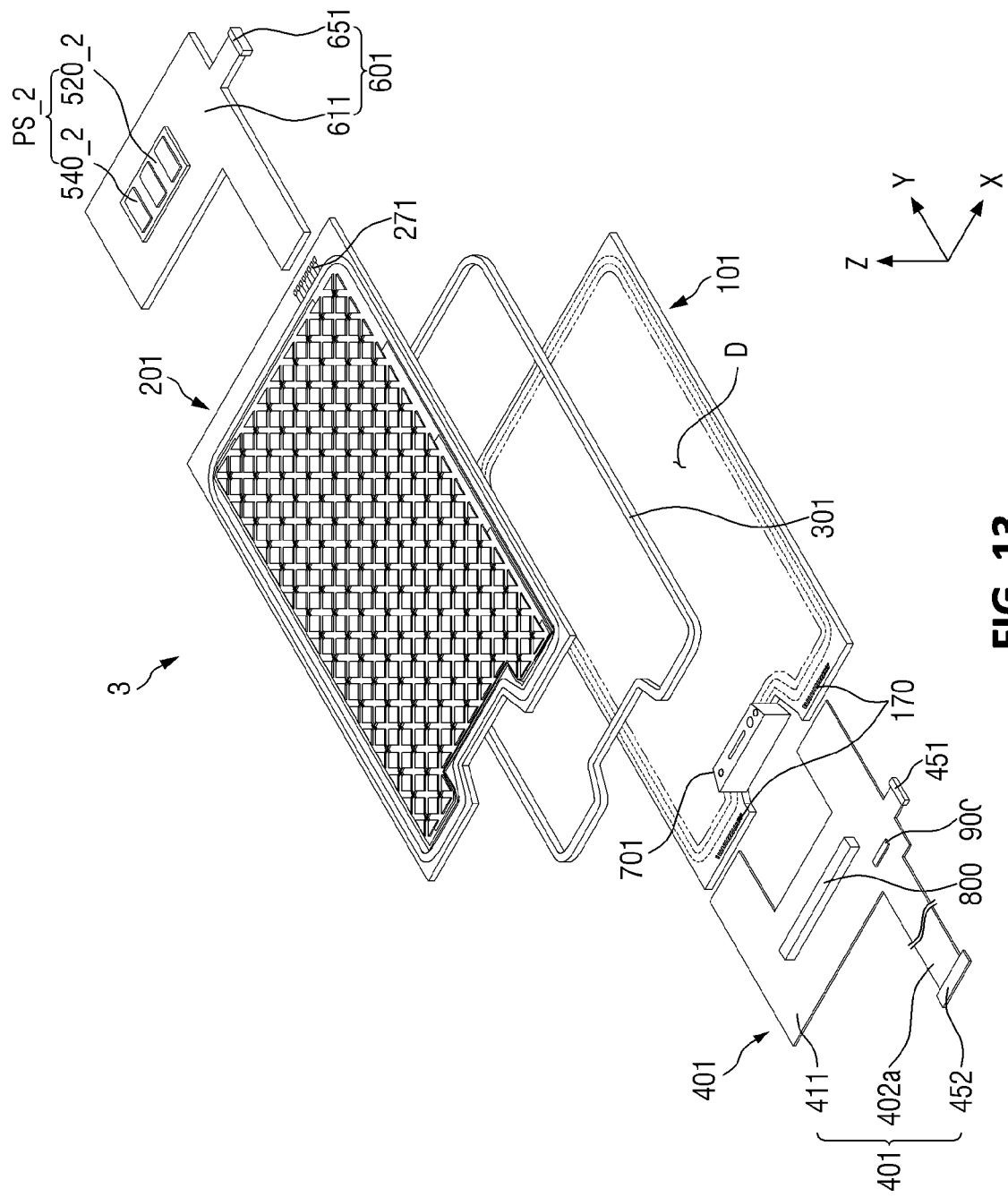
FIG. 13 is an exploded, perspective view of a display device according to another exemplary embodiment of the present disclosure.
Figure 14:
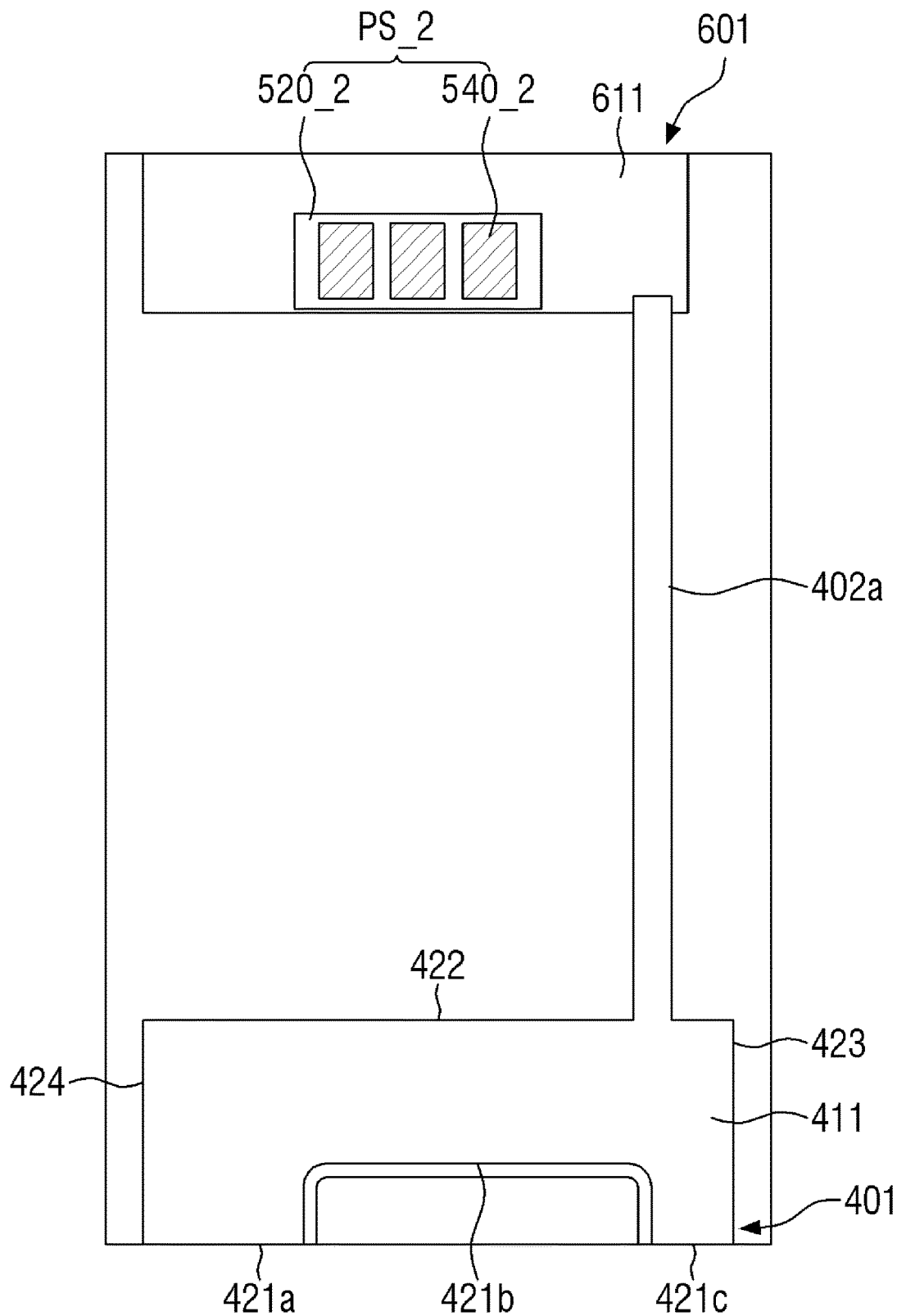
FIG. 14 is a view showing the layout of the display device of FIG. 13.

FIG. 13 is an exploded, perspective view of a display device according to yet another exemplary embodiment of the present disclosure; and FIG. 14 is a view showing the layout of the display device of FIG. 13.

A display device 3 according to another exemplary embodiment of FIGS. 13 and 14 is substantially the same as the display device 1 except that a pressure sensing member PS_2 is disposed on a third flexible circuit board 601 and may include a shielding electrode 520_2 and a pressure electrode 540_2.

Referring to FIGS. 13 and 14, although the bridge 402a of the first flexible circuit film 401 is disposed on the upper surface of the third flexible circuit film 601 and overlaps with a portion of the third flexible circuit film 601 in the thickness direction, the present disclosure is not limited thereto. The third flexible circuit film 601 may be disposed on the upper surface of the bridge 402a of the first flexible circuit film 401 and may overlap with a portion of the third flexible circuit film 601 in the thickness direction. In addition, as described above, a coupling layer or other element may be interposed between the bridge 402a of the first flexible circuit film 401 and the third flexible circuit film 601 overlapping in the thickness direction so that they are coupled with each other. For example, the bridge 402a and the third flexible circuit film 601 may be coupled with each other by an anisotropic conductive film (ACF). Specifically, an anisotropic conductive film (ACF) may be attached between the third flexible circuit film 601 and the bridge 402a, and they may be attached together by applying pressure and heat. In such case, the bridge 402a of the first flexible circuit film 401 may be directly connected to the third flexible circuit film 601. It is, however, to be understood that the present disclosure is not limited thereto. The end of the bridge 402a adjacent to the third flexible circuit film 601 may have a connector 452 as shown in the drawings, and the connector 452 may be fastened to a connector 651 of the third flexible circuit film 601.

Also in this exemplary embodiment, on the bridge 402a of the first flexible circuit film 401, a signal line is disposed that connects the pressure control member 900 on the first flexible circuit film 401 from the pressure sensing member PS_2 mounted on the third flexible circuit film 601.

The third flexible circuit film 601 may be bent toward the front face of the first base substrate 111 and may be coupled to each other by, for example, an anisotropic conductive film (ACF).

Although the bridge 402a is formed integrally with the first flexible circuit film 401 in this exemplary embodiment, the present disclosure is not limited thereto. That is, although not shown in the drawings, the third flexible circuit film 601 may have a bridge that has a width (e.g., a predetermined width) and protrudes in the second direction Y from the upper edge of the first base substrate 111, and the bridge of the third flexible circuit film 601 may be fastened to the first flexible circuit film 401. In an embodiment, the bridge 402a may be formed integrally with the third flexible circuit film 601. It is, however, to be understood that the present disclosure is not limited thereto. In an embodiment, the first flexible circuit film 401, the third flexible circuit film 601 and the bridge 402a may be formed integrally and may be bent toward the rear face of the first base substrate 111 to be coupled with it. In such case, it can be said that the first flexible circuit film 401 includes the third flexible circuit film 601 and the bridge. The first flexible circuit film 401 may be coupled with the pad portion 170 of the light-emitting substrate and may be bent toward the rear face of the first base substrate 111 to be coupled with it.

Also in this exemplary embodiment, if the pressure sensing member is disposed on the first flexible circuit board 401a disposed at the lower edge of the display device in the drawings, the user has to press the lower edge of the display device when she/he applies a pressure to achieve a desired operation of the display device. In doing so, however, the user may erroneously press another region (for example, a module region) adjacent to the pressure sensing member instead of the pressure sensing member, which deteriorates the user convenience. Further, since a user applies a pressure using her/his finger or other object while gripping the display device with the palm of the hand to apply the input, if the pressure sensing member is disposed at the lower edge of the display device, the center of gravity is formed upwardly (toward the module) when she/he uses the smartphone, such that it is inconvenient for the user to grip the smartphone. Further, in this case, the screen of the smartphone is hidden by the hand, and it is inconvenient for the user to see the screen.

In contrast, according to the above-described exemplary embodiment of the present disclosure, the pressure sensing member PS_2 is disposed adjacent to the upper edge of the rear face of the light-emitting substrate and is disposed apart from the lower edge where the first flexible circuit board 401 is disposed, such that the above-described issues are overcome and the user interface can be improved.

Figure 15:
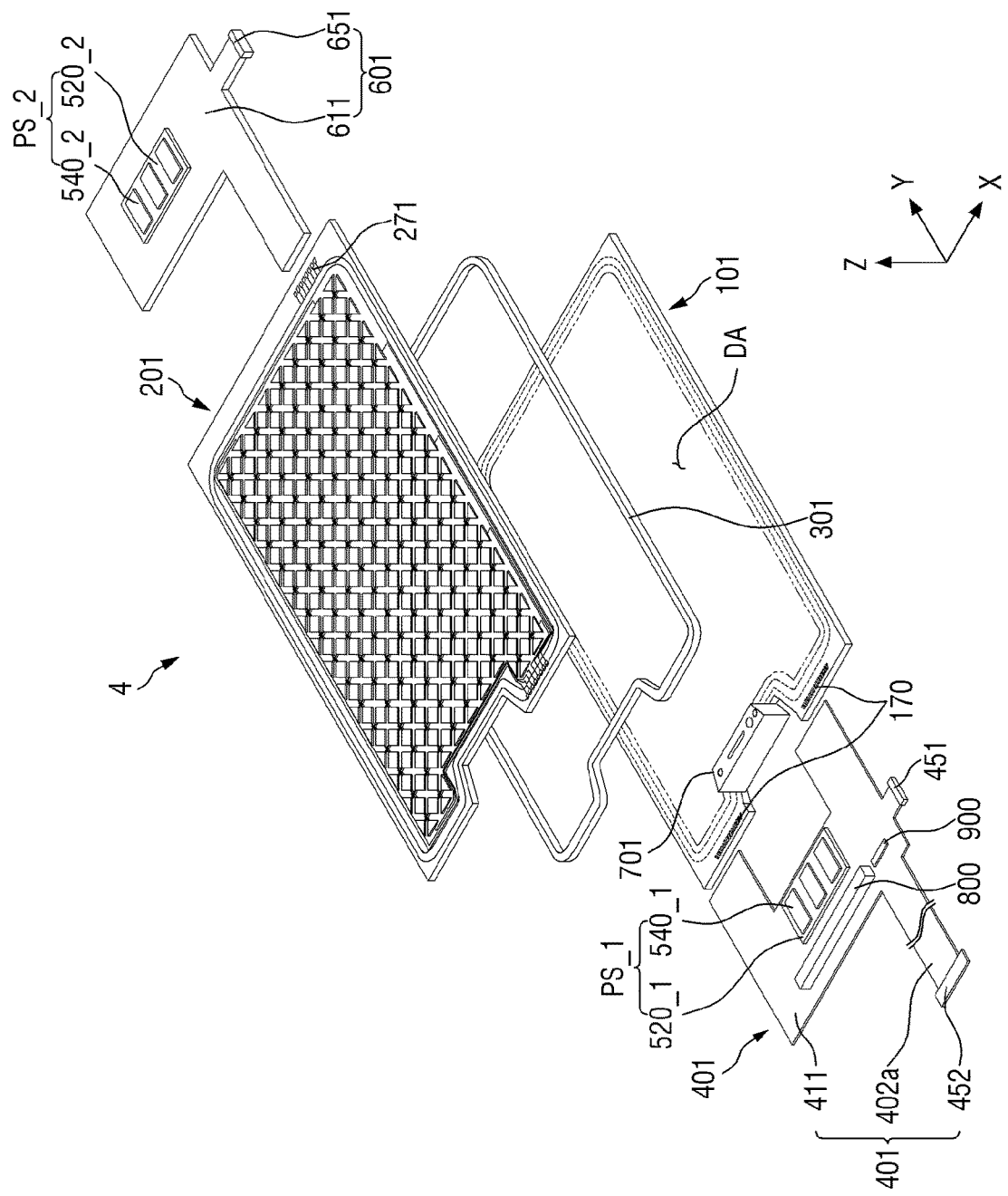
FIG. 15 is an exploded, perspective view of a display device according to another exemplary embodiment of the present disclosure.
Figure 16:
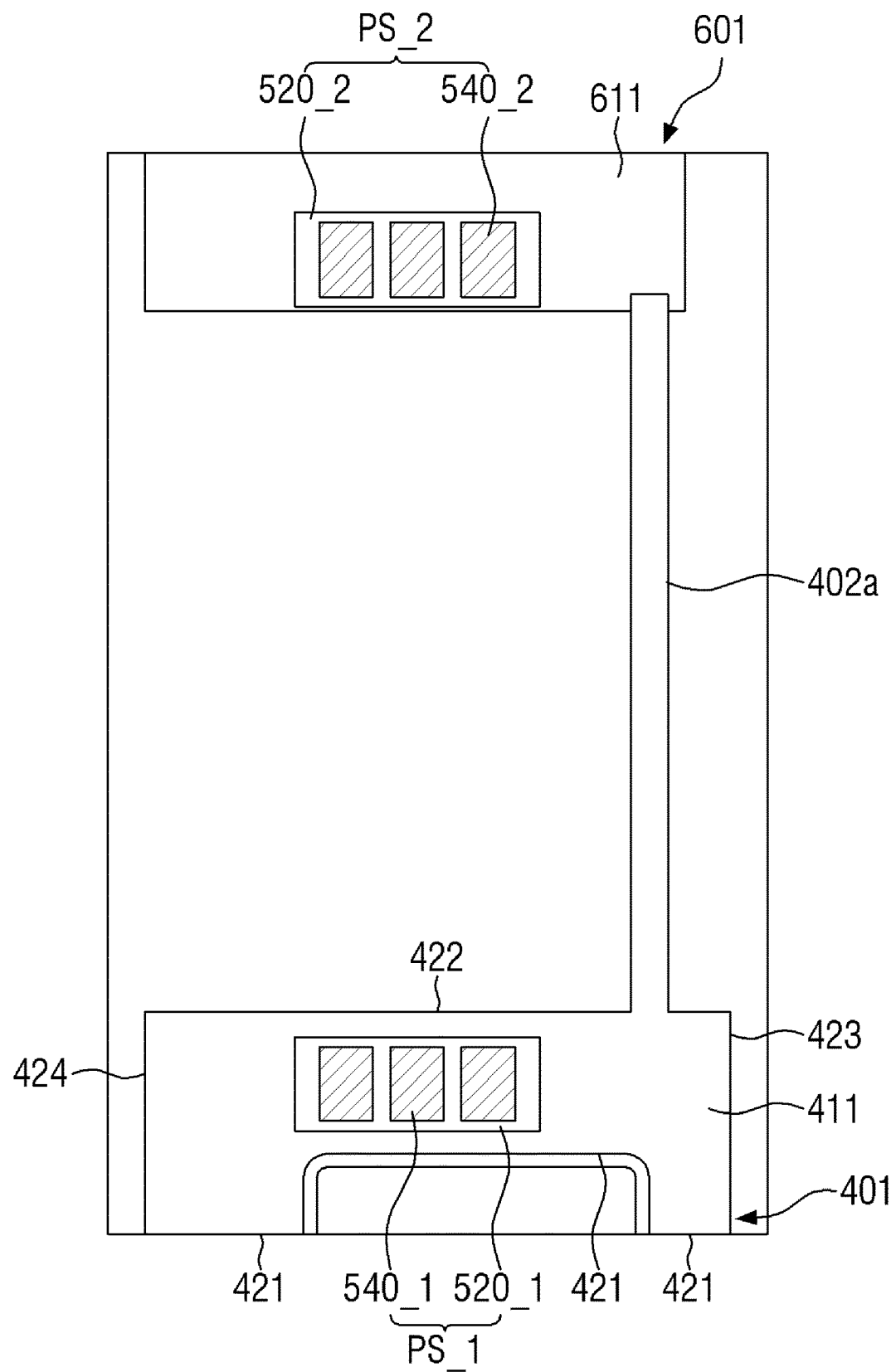
FIG. 16 is a view showing the layout of the display device of FIG. 15.

FIG. 15 is an exploded, perspective view of a display device according to another exemplary embodiment of the present disclosure; and FIG. 16 is a view showing the layout of the display device of FIG. 15.

A display device 4 according to another exemplary embodiment of FIGS. 15 and 16 is substantially the same as the display device 1 according to the exemplary embodiment of FIGS. 1 to 10B except that a pressure sensing member PS_2 is disposed on the third flexible circuit board 601 and that a pressure sensing member PS_1 is further disposed on the first flexible circuit board 401.

The pressure sensing member PS_2 disposed on the third flexible circuit board 601 has already described above with respect to the exemplary embodiment of FIGS. 13 and 14, and, therefore, the redundant description will be omitted.

The pressure sensing member PS_1 disposed on the first flexible circuit board 401 has already described above with respect to the exemplary embodiment of FIGS. 11 and 12, and, therefore, the redundant description will be omitted.

Also in this exemplary embodiment, if the pressure sensing member is disposed on the first flexible circuit board 401 disposed at the lower edge of the display device in the drawings, the user has to press the lower edge of the display device when she/he applies a pressure to achieve a desired operation of the display device. In doing so, however, the user may erroneously press another region (for example, a module region) adjacent to the pressure sensing member instead of the pressure sensing member, which deteriorates the user convenience. Further, since a user applies a pressure using her/his finger or other object while gripping the display device with the palm of the hand to apply the input, if the pressure sensing member is disposed at the lower edge of the display device, the center of gravity is formed upwardly (toward the module) when she/he uses the smartphone, such that it is inconvenient for the user to grip the smartphone. Further, in this case, the screen of the smartphone is hidden by the hand, and it is inconvenient for the user to see the screen.

In contrast, according to the above-described exemplary embodiment of the present disclosure, the pressure sensing member PS_1 is disposed adjacent to the upper edge of the rear face of the light-emitting substrate and is disposed apart from the lower edge where the first flexible circuit board 401 is disposed, such that the above-described issues are overcome and the user interface can be improved.

Although some exemplary embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A display device comprising:
a display panel;
a first board connected to a side of a first surface of the display panel and bent in a direction of the display panel to overlap with the display panel;
a second board connected to another side of the first surface of the display panel and bent in the direction of the display panel to overlap with the display panel;
a driving member on the first board; and
a first pressure sensing member on the second board disposed on a second surface of the display panel that is opposite the first surface such that the second surface of the display panel is between the first surface and the first pressure sensing member,
wherein the first board is connected to the second board on the second surface of the display panel,
wherein the first board comprises a first portion attached to the side of the first surface of the display panel, and a second portion protruding from the first portion toward the other side of the display panel,
wherein the second portion of the first board is connected to the second board, and
wherein a width of the second portion is smaller than a width of the first portion.

2. The display device of claim 1, wherein the driving member is electrically connected to the first pressure sensing member.

3. The display device of claim 2, wherein the first pressure sensing member comprises a first conductive layer on a surface of the second board, and a second conductive layer on the first conductive layer.

4. The display device of claim 3, wherein the first conductive layer comprises a shielding electrode.

5. The display device of claim 4, further comprising:
a bracket on the second surface of the display panel and on a surface of the first pressure sensing member, the bracket covering the display panel and the first pressure sensing member,
wherein the bracket comprises a metallic material.

6. The display device of claim 5, wherein the first pressure sensing member comprises a first insulating layer between the first conductive layer and the second conductive layer, and a second insulating layer between the second conductive layer and the bracket, and
wherein the second insulating layer comprises a dielectric material to insulate the second conductive layer from the bracket.

7. The display device of claim 6, wherein the bracket forms a capacitance with the second conductive layer, with the second insulating layer therebetween.

8. The display device of claim 3, further comprising a second pressure sensing member on the first board.

9. The display device of claim 8, wherein the second pressure sensing member comprises:
a third conductive layer on a surface of the first board;
a fourth conductive layer on the third conductive layer;
a third insulating layer between the third conductive layer and the fourth conductive layer; and
a fourth insulating layer on the fourth conductive layer.

10. The display device of claim 9, wherein the third conductive layer comprises a shielding electrode, and the fourth insulating layer comprises a dielectric material.

11. The display device of claim 1, further comprising:
a touch panel above the display panel; and
a third board connected to a side of a surface of the touch panel and overlapping with the display panel in a thickness direction,
wherein the third board is connected to the first board.

12. A display device comprising:
a display panel;
a touch panel above the display panel;
a first printed circuit board connected to a side of a first surface of the display panel and bent in a direction of the display panel to overlap with the display panel;
a second printed circuit board connected to a side of a surface of the touch panel adjacent to another side of the display panel and bent in the direction of the display panel to overlap with the display panel;
a driving member on the first printed circuit board; and
a first pressure sensing member on the second printed circuit board disposed on a second surface of the display panel that is opposite the first surface such that the second surface of the display panel is between the first surface and the first pressure sensing member, wherein the first printed circuit board is connected to the second printed circuit board on the second surface of the display panel, wherein the first printed circuit board comprises a first portion attached to the side of the first surface of the display panel, and a second portion protruding from the first portion toward the other side of the display panel, wherein the second portion of the first printed circuit board is connected to the second printed circuit board, and wherein a width of the second portion is smaller than a width of the first portion.

13. The display device of claim 12, wherein the driving member is electrically connected to the first pressure sensing member.

14. The display device of claim 12, wherein the first pressure sensing member comprises:

a first conductive layer on the second printed circuit board;

a second conductive layer above the first conductive layer;

a first insulating layer between the first conductive layer and the second conductive layer; and a second insulating layer on the second conductive layer.

15. The display device of claim 14, further comprising a second pressure sensing member on the first printed circuit board.

16. The display device of claim 15, wherein the second pressure sensing member comprises:

a third conductive layer on the first printed circuit board;

a fourth conductive layer above the third conductive layer;

a third insulating layer between the third conductive layer and the fourth conductive layer; and a fourth insulating layer on the fourth conductive layer.

\* \* \* \* \*